(12) United States Patent
Ikeda et al.

(10) Patent No.: US 7,575,961 B2
(45) Date of Patent: Aug. 18, 2009

(54) ELECTROOPTICAL DEVICE AND A METHOD OF MANUFACTURING THE SAME

(75) Inventors: Takayuki Ikeda, Kanagawa (JP); Shunpei Yamazaki, Tokyo (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 293 days.

(21) Appl. No.: 11/529,334

(22) Filed: Sep. 29, 2006

(65) Prior Publication Data
US 2007/0026583 A1 Feb. 1, 2007

Related U.S. Application Data

(62) Division of application No. 09/542,473, filed on Apr. 4, 2000, now Pat. No. 7,122,835.

(30) Foreign Application Priority Data
Apr. 7, 1999 (JP) ............................... 11-099683

(51) Int. Cl.
*H01L 21/00* (2006.01)
(52) U.S. Cl. .................. 438/149; 438/151; 438/157; 438/283; 257/59; 257/72; 257/E21.4; 257/E21.409
(58) Field of Classification Search .................. 438/149, 438/151–154, 157, 283; 257/59, 72, 351
See application file for complete search history.

(56) References Cited

U.S. PATENT DOCUMENTS

| | | | |
|---|---|---|---|
| 4,409,724 A | 10/1983 | Tasch et al. | |
| 4,823,180 A | 4/1989 | Wieder et al. | |
| 4,851,370 A | 7/1989 | Doklan et al. | |
| 4,886,962 A | 12/1989 | Gofuku et al. | |
| 4,984,033 A | 1/1991 | Ishizu et al. | |
| 5,182,620 A | 1/1993 | Shimada et al. | |
| 5,287,206 A | 2/1994 | Kanemori et al. | |

(Continued)

FOREIGN PATENT DOCUMENTS

EP          0 989 614 A2       3/2000

(Continued)

OTHER PUBLICATIONS

Shiroh Inui et al.; "Thresholdless Antiferroelectricity in Liquid Crystals and its Aplication to Displays"; Journal of Materials Chemistry; 1996; vol. 6, No. 4, pp. 671-673.

(Continued)

*Primary Examiner*—Hsien-ming Lee
(74) *Attorney, Agent, or Firm*—Nixon Peabody LLP; Jeffrey L. Costellia

(57) ABSTRACT

To provide a semiconductor device of high reliability by arranging TFTs that have appropriate structures in accordance with circuit functions. In a semiconductor device having a driver circuit portion and a pixel portion on the same insulator, gate insulating films of a driver TFT are designed to be thinner than a gate insulating film of a pixel TFT. In the pixel TFT, channel forming regions are formed under a gate electrode, and a separation region is formed between the channel forming regions. At this point, LDD regions have a region that overlaps with the gate electrode and a region that does not.

20 Claims, 20 Drawing Sheets

U.S. PATENT DOCUMENTS

| | | |
|---|---|---|
| 5,292,675 A | 3/1994 | Codama |
| 5,323,042 A | 6/1994 | Matsumoto |
| 5,341,012 A | 8/1994 | Misawa et al. |
| 5,343,066 A | 8/1994 | Okamoto et al. |
| 5,365,079 A | 11/1994 | Kodaira et al. |
| 5,412,493 A | 5/1995 | Kunii et al. |
| 5,508,209 A | 4/1996 | Zhang et al. |
| 5,528,056 A | 6/1996 | Shimada et al. |
| 5,594,569 A | 1/1997 | Konuma et al. |
| 5,608,251 A | 3/1997 | Konuma et al. |
| 5,616,935 A | 4/1997 | Koyama et al. |
| 5,620,905 A | 4/1997 | Konuma et al. |
| 5,643,826 A | 7/1997 | Ohtani et al. |
| 5,652,158 A | 7/1997 | Bae |
| 5,712,495 A | 1/1998 | Suzawa |
| 5,739,549 A | 4/1998 | Takemura et al. |
| 5,757,444 A | 5/1998 | Takemura |
| 5,767,930 A | 6/1998 | Kobayashi et al. |
| 5,818,552 A | 10/1998 | Sato |
| 5,852,488 A | 12/1998 | Takemura |
| 5,856,689 A | 1/1999 | Suzawa |
| 5,882,960 A | 3/1999 | Zhang et al. |
| 5,895,933 A | 4/1999 | Zhang et al. |
| 5,923,962 A | 7/1999 | Ohtani et al. |
| 5,942,310 A | 8/1999 | Moon |
| 5,953,582 A | 9/1999 | Yudasaka et al. |
| 5,998,838 A | 12/1999 | Tanabe et al. |
| 5,998,841 A | 12/1999 | Suzawa |
| 6,013,929 A | 1/2000 | Ohtani |
| 6,066,860 A | 5/2000 | Katayama et al. |
| 6,067,132 A | 5/2000 | Kim |
| 6,088,070 A | 7/2000 | Ohtani et al. |
| 6,137,551 A | 10/2000 | Jeong |
| 6,140,162 A | 10/2000 | Yeo |
| 6,166,436 A | 12/2000 | Maeda et al. |
| 6,172,728 B1 | 1/2001 | Hiraishi |
| 6,271,818 B1 | 8/2001 | Yamazaki et al. |
| 6,278,131 B1 | 8/2001 | Yamazaki et al. |
| 6,316,787 B1 | 11/2001 | Ohtani |
| 6,323,490 B1 | 11/2001 | Ikeda et al. |
| 6,330,044 B1 | 12/2001 | Murade |
| 6,337,731 B1 | 1/2002 | Takemura |
| 6,399,988 B1 | 6/2002 | Yamazaki |
| 6,490,014 B1 | 12/2002 | Ohtani et al. |
| 6,501,132 B1 | 12/2002 | Ohtani |
| 6,531,713 B1 | 3/2003 | Yamazaki |
| 6,579,736 B2 | 6/2003 | Yamazaki |
| 6,590,229 B1 | 7/2003 | Yamazaki et al. |
| 6,593,592 B1 | 7/2003 | Yamazaki |
| 6,639,244 B1 | 10/2003 | Yamazaki et al. |
| 6,663,244 B1 | 12/2003 | Wichner |
| 6,693,681 B1 | 2/2004 | Takemura |
| 6,734,924 B2 | 5/2004 | Hirakata et al. |
| 6,770,936 B2 * | 8/2004 | Inoue et al. ................. 257/347 |
| 6,777,255 B2 | 8/2004 | Yamazaki |
| 2001/0000627 A1 | 5/2001 | Hayakawa et al. |
| 2001/0029070 A1 | 10/2001 | Yamazaki et al. |
| 2004/0056296 A1 | 3/2004 | Arao et al. |
| 2004/0065882 A1 | 4/2004 | Yamazaki et al. |

FOREIGN PATENT DOCUMENTS

| | | |
|---|---|---|
| GB | 2307326 | 5/1997 |
| JP | 63-222443 | 9/1988 |
| JP | 03-091721 | 4/1991 |
| JP | 05-061069 | 3/1993 |
| JP | 05-307165 | 11/1993 |
| JP | 07-130652 | 5/1995 |
| JP | 07-130974 | 5/1995 |
| JP | 07-135323 | 5/1995 |
| JP | 07-169974 | 7/1995 |
| JP | 07-169975 | 7/1995 |
| JP | 07-218932 | 8/1995 |
| JP | 07-321339 | 12/1995 |
| JP | 07-326767 | 12/1995 |
| JP | 09-074204 | 3/1997 |
| JP | 09-312260 | 12/1997 |
| JP | 09-312620 | 12/1997 |
| JP | 10-012895 | 1/1998 |
| JP | 10-056184 | 2/1998 |
| JP | 10-247735 | 9/1998 |
| JP | 11-097701 | 4/1999 |

OTHER PUBLICATIONS

Lee et al., "*New Polycrystalline Silicon TFT's with Selectively Doped Region in the Channel*", Proceedings of the Sixth International Display Workshops, Dec. 1, 1999, pp. 1097-1098.

Shimokawa et al., "Characterization of High-Efficiency Cast-Si Solar Cell Wafers by MBIC Measurement", Japanese Journal of Applied Physics, vol. 27, No. 5, May 1988, pp. 751-758.

Furue et al., "P-78: Characteristics and Driving Scheme of Polymer-Stabilized Monostable FLCD Exhibiting Fast Response Time and High Contrast Ratio with Gray-Scale Capability", SID 98 Digest, © 1998, pp. 782-785.

Yoshida et al., "33.2: A Full-Color Thresholdless Antiferroelectric LCD Exhibiting Wide Viewing Angle with Fast Response Time", SID 97 Digest, © 1997, pp. 841-844.

* cited by examiner

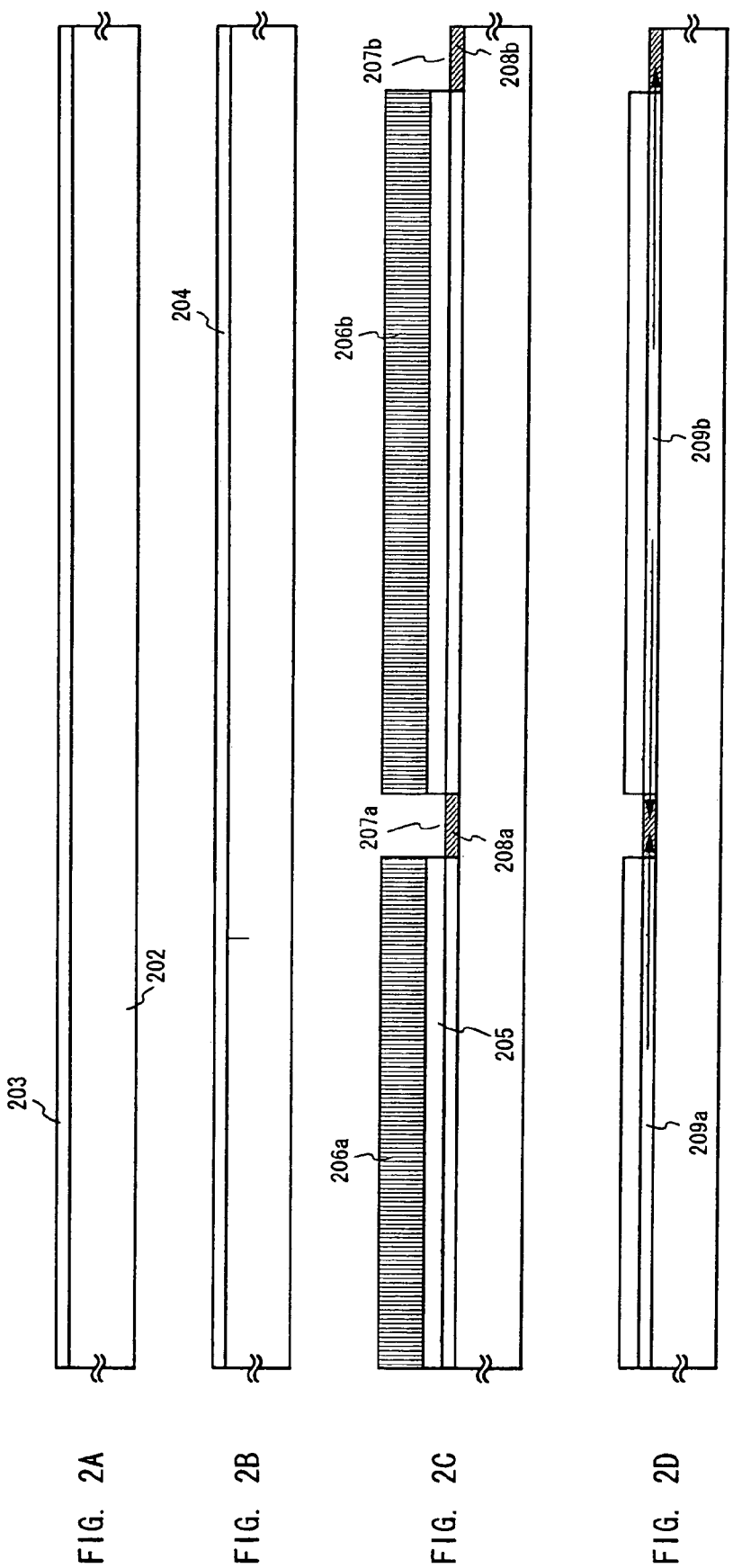

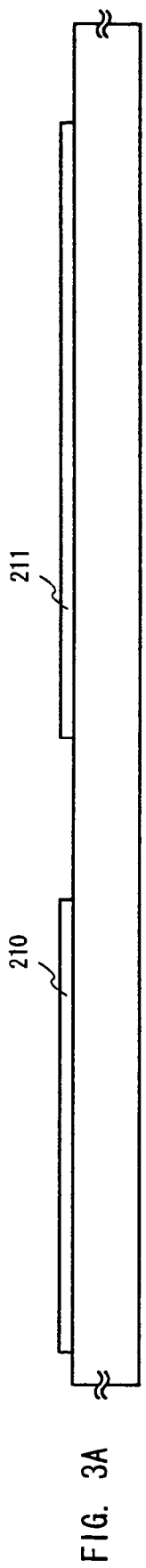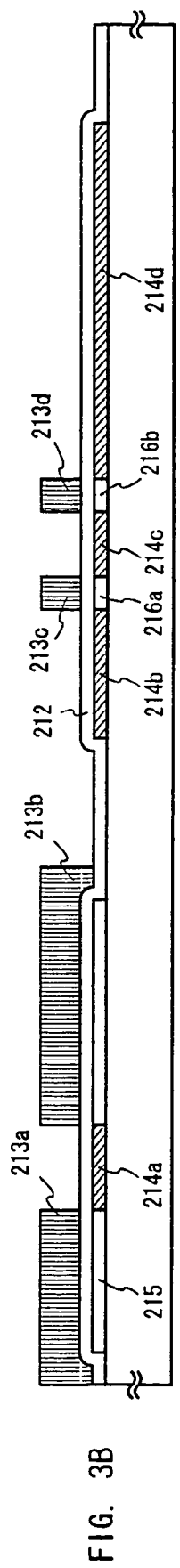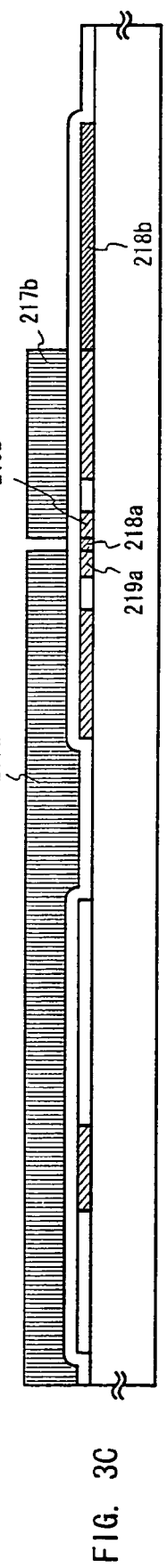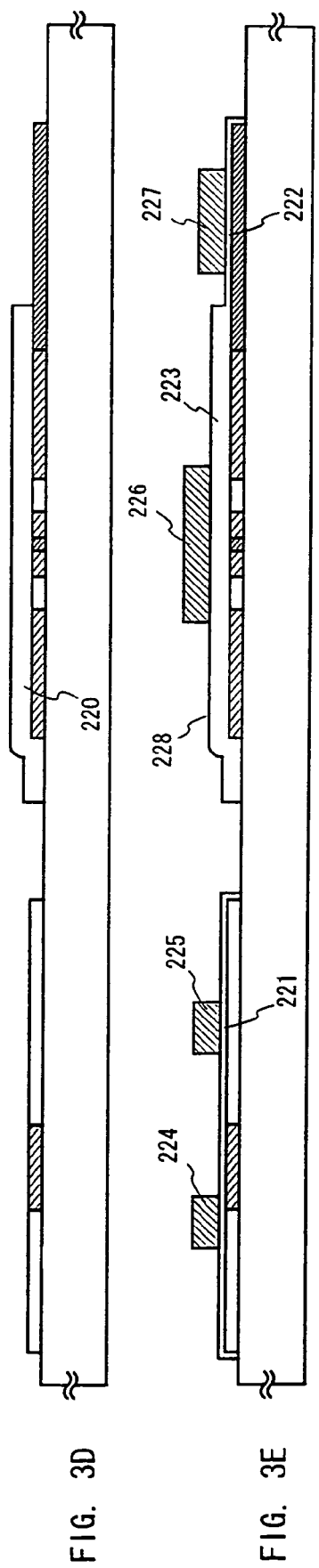

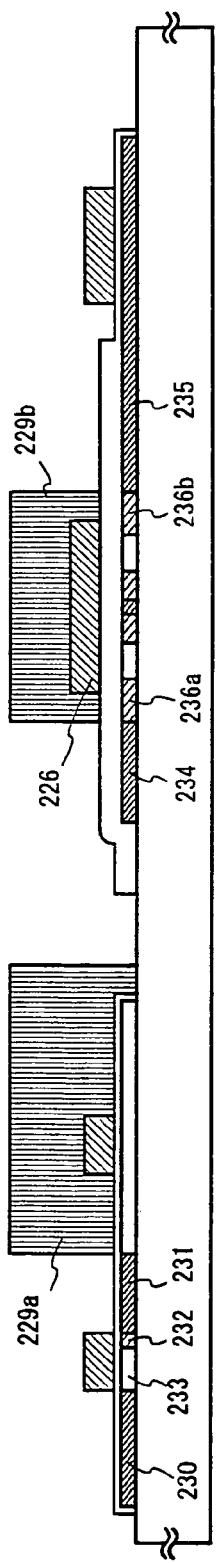
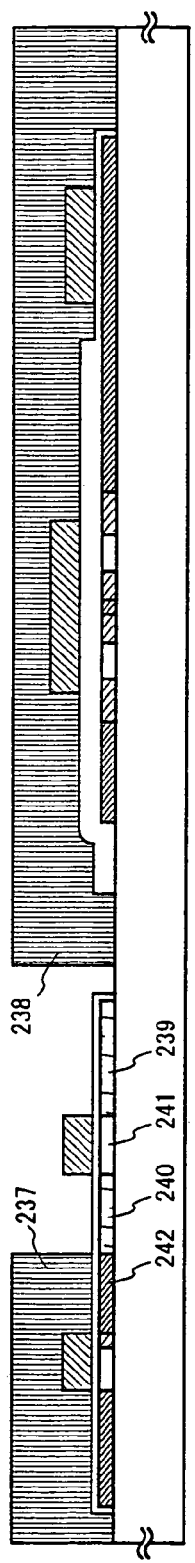
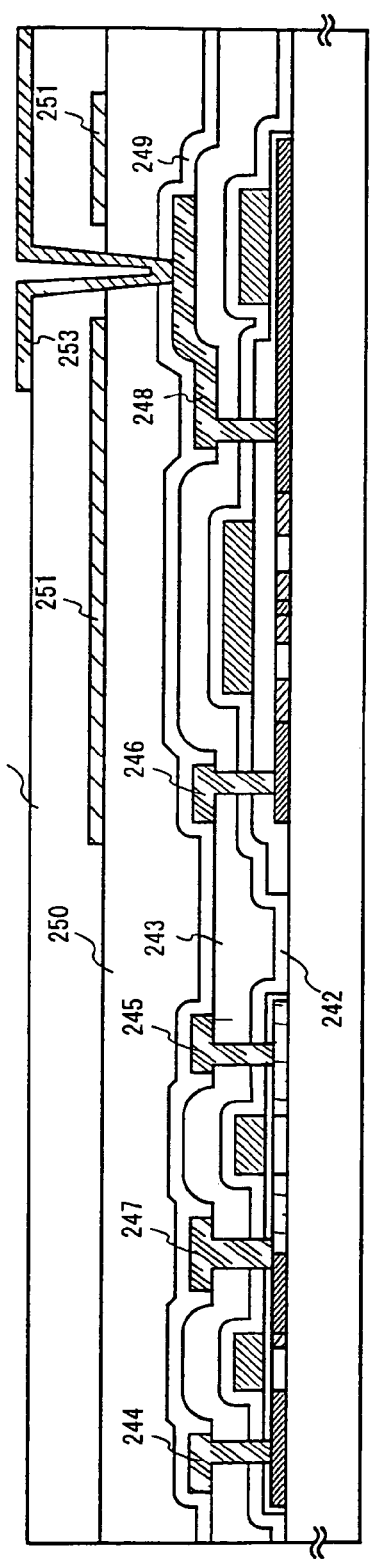
FIG. 4A
FIG. 4B
FIG. 4C

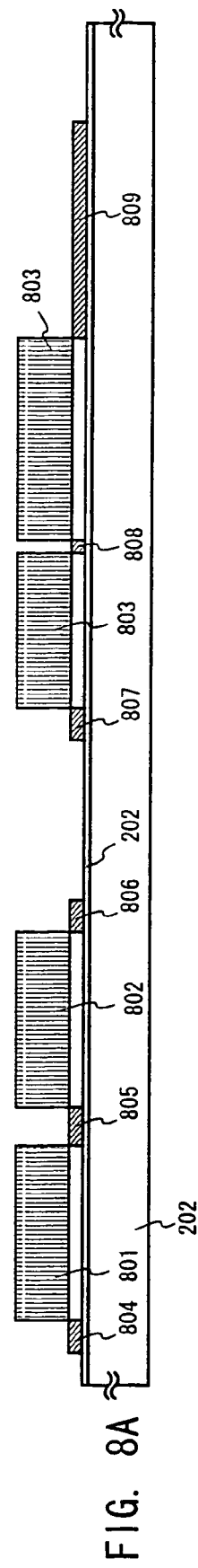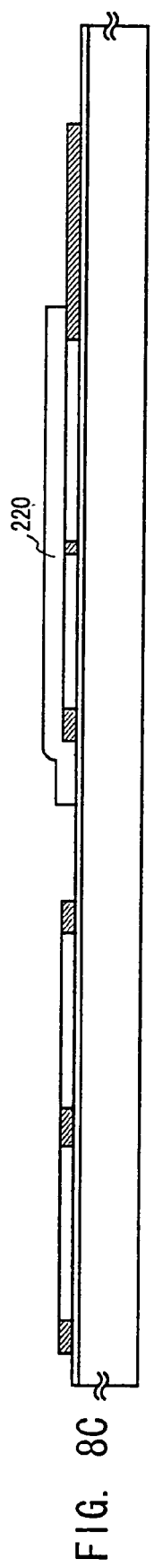

ELECTROOPTICAL DEVICE AND A METHOD OF MANUFACTURING THE SAME

BACKGROUND OF THE INVENTION

1. Field of the Invention

The present invention relates to a semiconductor device having a circuit that comprises a thin film transistor (hereinafter referred to as TFT). For instance, the invention relates to the structure of an electrooptical device represented by a liquid crystal display and an EL display, and of an electronic equipment equipped with such electrooptical device as one of its parts. The term 'semiconductor device' in this specification designates devices in general which utilize semiconductor characteristics to function and, therefore, the electrooptical device, the semiconductor circuit and the electronic equipment all fall into the range of the semiconductor device.

2. Description of the Related Art

Application of TFTs (Thin Film Transistors) to active matrix liquid crystal displays (hereinafter referred to as AM-LCDs) has actively been developed because TFTs allow of the use of inexpensive substrates on which they are to be formed. Among TFTs, the one that utilizes a crystalline semiconductor film (typically, a polysilicon film) can provide a high mobility and hence is considered to be suitable for integrating functional circuits on the same substrate to realize image display of high definition.

Basically, an AM-LCD comprises a pixel portion (a region where a plurality of pixels are arranged) for displaying an image and a driver circuit portion for driving a TFT of each of the pixels arranged in the pixel portion, the portions formed on the same substrate. The driver circuit portion may be divided into a gate line driver circuit (gate driver circuit) driving a gate line and a source line driver circuit (source driver circuit) transmitting a video signal to each TFT.

In the System on Panel, proposed lately, a logical circuit portion including a signal divider circuit, γ correction circuit is formed on the same substrate other than the pixel portion and the driver circuit (also called as a peripheral driver circuit) portion.

However, capabilities required for TFTs are different between the pixel portion and the driver circuit portion, thereby making it difficult to meet all ways with one TFT structure. In other words, the TFT structure in which a TFT for forming a driver circuit such as a shift resister circuit or a latch circuit where the importance is attached to high speed operation is compatible with a TFT for forming a buffer circuit, a sampling circuit, or a pixel circuit that gives importance to high withstand voltage characteristic has not been established yet under the present circumstances.

SUMMARY OF THE INVENTION

The present invention has been made in view of the above problem and therefore, an object of the present invention is to provide an electrooptical device excellent in circuit characteristics obtained by arranging TFTs having appropriate structures in accordance with the respective TFT ways (capabilities required for the TFTs).

Another object of the invention is to provide a TFT structure for a pixel portion in which a storage capacitor capable of securing a large capacitance is formed in a small area. Also will be provided is a structure for a pixel TFT that has a small area and is sufficiently low in the OFF current value.

Still another object of the present invention is to realize an electrooptical device having high performance and high reliability, and to enhance the performance and the reliability of an electronic equipment that has such electrooptical device as a display unit (display means).

In order to attain the objects stated above, in the present invention, the TFT structure varies in different portions (for instance, between a driver circuit portion and a pixel portion) of a semiconductor device, depending on functions of the respective portions, to thereby improve the performance of the semiconductor device as a whole.

To be specific, a TFT, which is structured such that its LDD regions overlap with a gate electrode with a gate insulating film interposed therebetween and which is in result strong against the degradation due to hot carrier injection, is arranged in a portion where the importance is attached to high operation speed (as in the driver circuit including a shift register circuit and a latch circuit). This structure is especially effective in an N channel type TFT that is high in field effect mobility. At this point, the LDD regions completely overlap with the gate electrode to reduce the resistance component as much as possible. It is preferable to form the LDD regions only on the drain region side in order to further reduce the resistance component.

On the other hand, a portion that gives importance to low OFF current value (e.g., the pixel portion including pixel TFTs, a sampling circuit) has a region where LDD regions overlap with a gate electrode with a gate insulating film interposed therebetween and a region where LDD regions do not overlap with a gate electrode, to thereby reduce the OFF current value. The region where the LDD regions do not overlap with the gate electrode plays a very significant role in reducing the OFF current value.

In the portion where high operation speed is given importance, the operation speed is increased by forming a thinner film for the gate insulating film than that of a gate insulating film of the pixel TFT. What makes this contrivance possible is the fact that the portion where high operation speed is given importance do not need as high gate insulating withstand voltage as that of the pixel TFT. Thinning the gate insulating film as such is not preferable in the pixel TFT, the buffer circuit, or the sampling circuit.

However, if a storage capacitor is to be formed in the pixel portion as in the present invention, the storage capacitor is required to hold a large capacitance while occupying as small area as possible. Therefore, a dielectric film for the storage capacitor is preferred to be as thin as it can be.

Then the present invention assumes a feature, along with other features, in that the gate insulating film of the TFT to be formed in the portion where the importance is attached to the operation speed, as in the driver circuit, and the dielectric of the storage capacitor to be formed in the pixel portion are formed simultaneously, thereby reducing the number of steps and simplifying the process.

The pixel TFT of the present invention has at least two channel forming regions and high concentration impurity regions formed between the channel forming regions, under a gate electrode with a gate insulating film interposed therebetween. The pixel TFT also has a pair of low concentration impurity regions in contact with a source region and a drain region. The low concentration impurity regions include a region that overlaps with the gate electrode with the gate insulating film interposed therebetween and a region that does not. With this arrangement, capability equivalent to the conventional double gate structure TFT can be accomplished in a single gate structure TFT that occupies smaller area than the double gate structure TFT.

As described above, reduction in the occupied area of the storage capacitor and the pixel TFT in the pixel portion makes it possible to enlarge a region capable of displaying an image (to improve the opening ratio).

BRIEF DESCRIPTION OF THE DRAWINGS

In the accompanying drawings:

FIGS. 2A to 2D are views showing a process of manufacturing an active matrix substrate;

FIGS. 3A to 3E are views showing the process of manufacturing the active matrix substrate;

FIGS. 4A to 4C are views showing the process of manufacturing the active matrix substrate;

FIGS. 8A to 8C are views showing a process of manufacturing an active matrix substrate;

DETAILED DESCRIPTION OF THE PREFERRED EMBODIMENTS

Figure 1:
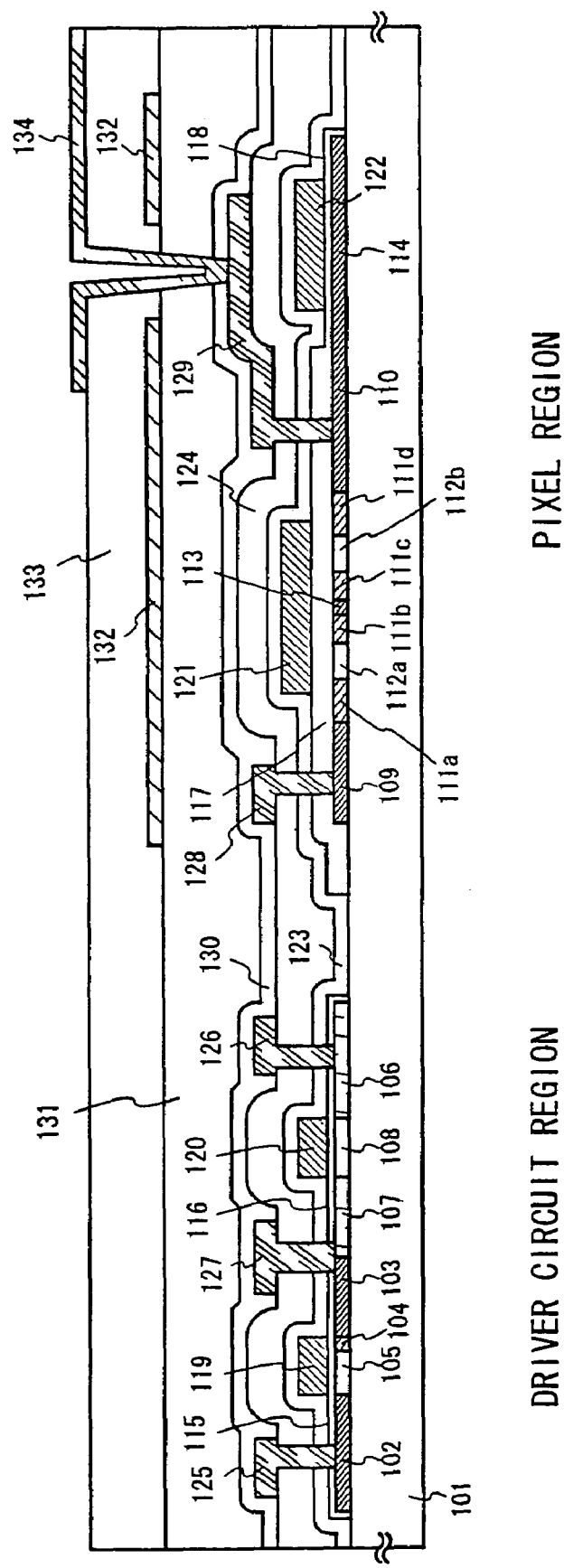
FIG. 1 is a view showing the sectional structure of an active matrix substrate.

An embodiment mode of the present invention will be described with reference to FIG. 1. FIG. 1 is a sectional view showing an AM-LCD in which a driver circuit portion and a pixel portion are integrally formed on the same insulator. A CMOS circuit is shown here as a basic circuit for constituting the driver circuit portion. Though a pixel TFT shown here has a structure in which two channel forming regions are formed under one gate electrode, three or more channel forming regions may be formed.

In FIG. 1, reference symbol 101 denotes an insulator (substrate) having heat resistance. A quartz substrate, a silicon substrate, a ceramic substrate, or a metal substrate (typically a stainless steel substrate) may be used for the insulator. A base film (preferably an insulating film containing silicon) may be formed if necessary on any of those substrates.

Formed on the substrate 101 are an active layer of a TFT for forming the driver circuit (hereinafter referred to as a driver TFT), an active layer of a TFT provided in each pixel (hereinafter referred to as a pixel TFT), and a semiconductor layer to be an electrode of a storage capacitor.

The active layer of the driver TFT in FIG. 1 is comprised of an N channel type TFT (hereinafter referred to as NTFT) and a P channel type TFT (hereinafter referred to as PTFT), the NTFT including a source region 102, a drain region 103 and a low concentration impurity region (hereinafter referred to as an LDD region in this specification) 104 that overlaps with a gate wiring with a gate insulating film interposed therebetween, and the PTFT including a source region 106, a drain region 107 and a channel forming region 108. Incidentally, LDD is abbreviation for Lightly Doped Drain.

The active layer of the pixel TFT (here, NTFT) has a source region 109, a drain region 110, LDD regions 111a to 111d and channel forming regions 112a, 112b. A high concentration impurity region (hereinafter referred to as a separation region) 113 doped with a high concentration of element that belongs to group XV in the periodic table is formed between the channel forming regions 112a and 112b. This region is very significant in lowering the OFF current value (drain current value flowing when the TFT is in OFF operation).

At this point, the LDD region 104 of the driver TFT and the LDD regions 111a to 111d of the pixel TFT contain an element that belongs to group XV in the periodic table (typically, phosphorus or arsenic) in a concentration of $2\times10^{16}$ to $5\times10^{19}$ atoms/cm$^3$ (preferably $5\times10^{17}$ to $5\times10^{18}$ atoms/cm$^3$). The separation region 113 of the pixel TFT contains an element that belongs to group XV in the periodic table (typically, phosphorus or arsenic) in a concentration of $5\times10^{19}$ to $3\times10^{21}$ atoms/cm$^3$ (preferably $1\times10^{20}$ to $5\times10^{20}$ atoms/cm$^3$).

The semiconductor layer extending from the drain region 110 is used as the electrode of the storage capacitor (hereinafter referred to as a first capacitor electrode) 114. To be strict, the first capacitor electrode 114 is a part of the semiconductor layer which is electrically connected to a pixel electrode. That is, though the first capacitor electrode is formed from the semiconductor layer extending from the drain region in here, it may be formed from a region electrically connected to the drain region by a wiring.

For the convenience of explanation, a region denoted by 109 is called a source region and a region denoted by 110 is called a drain region in this embodiment mode. However, the source region and the drain region may be switched depending on the direction of drain current flowing through the pixel TFT. The region 109 may thus be called the drain region while the region 110 may be called the source region.

To arrange two or more channel forming regions (112a, 112b) and the high concentration impurity regions (111b, 111c, 113) separating the channel forming regions from each other under the gate wiring having a single gate structure realizes a pixel TFT that has a capability equivalent to that of the conventional double gate structure TFT while occupying a smaller region than the double gate TFT.

Similar structure is disclosed in Japanese Patent Application Laid-open No. Hei 7-326767. However, LDD regions do not overlap with a gate electrode in the structure disclosed in the publication. The present invention is a technology different from that of the publication in that LDD regions overlap with a gate electrode in order to suppress degradation of ON current (drain current flowing when a TFT is in ON operation) due to hot carrier injection.

That is, the difference between the structure of the present invention and the structure disclosed in the above publication resides in that, in the present invention, the LDD region 111a that is in contact with the source region 109 and the LDD region 111d that is in contact with the drain region 110 have a region that overlaps with a gate electrode 121 with the gate insulating film interposed therebetween and a region that does not. In the structure of the present invention, the region where the LDD regions overlaps with the gate electrode with the gate insulating film interposed therebetween helps to suppress the degradation of the ON current value while the region where the LDD regions do not overlap with the gate electrode helps to suppress the increase of the OFF current value. In short, the structure is capable of suppressing the degradation of the ON current value and the increase of the OFF current value at once.

The gate insulating film is formed next to cover the active layer and the first capacitor electrode. In FIG. 1, gate insulating films 115 (on the NTFT side), 116 (on the PTFT side) of the driver TFT are thinner than a gate insulating film 117 of the pixel TFT. Typically, the thickness of the gate insulating films 115, 116 is set to 5 to 50 nm (preferably 10 to 30 nm) and the thickness of the gate insulating film 117 is set to 50 to 200 nm (preferably 100 to 150 nm).

The gate insulating films of the driver TFT do not necessarily have the same thickness. In other words, driver TFTs having gate insulating films whose thickness is different from each other may coexist in the driver circuit. This means that at least three kinds of TFTs, which are different from one-another in the thickness of the gate insulating films, are formed on the same insulator. Also conceivable is the case where the thickness of the gate insulating film of the driver TFT differs from the dielectric film thickness of the storage capacitor-and neither of them is equal to the thickness of gate insulating film of the pixel TFT. For instance, the case where the gate insulating films of driver TFT (a circuit that especially requires high-speed operation) and of the pixel TFT are 5 to 10 nm and 100 to 150 nm in thickness, respectively, while the dielectric of the storage capacitor has a thickness of 30 to 50 nm.

However, in the structure shown in FIG. 1, a dielectric 118 of the storage capacitor is formed from the insulating film that is formed at the same time as the gate insulating films 115, 116 of the driver TFT. That is, the gate insulating films of the driver TFT and the dielectric of the storage capacitor are insulating films comprising the same material and have the same thickness.

By forming a thin dielectric for the storage capacitor as above, the capacity can be gained without enlarging the area for forming the capacitor. Another advantage is that the number of steps of manufacturing the TFTs is not increased by this.

Next, gate electrodes 119, 120 of the driver TFT and a gate electrode 121 of the pixel TFT are formed on the gate insulating films 115 to 117. Simultaneously, an electrode 122 (hereinafter referred to as a second capacitor electrode) of the storage capacitor is formed on the dielectric 118 of the storage capacitor. A conductive film that is resistant to the heat at a temperature of 700 to 1150° C. (preferably 900 to 1100° C.) is used as a material for forming the gate electrodes 119 to 121 and the second capacitor electrode 122.

Typical example for the conductive film includes silicon films having conductivity (e.g., a phosphorus doped silicon film, a boron doped silicon film, etc.), metal films (e.g., a tungsten film, a tantalum film, a molybdenum film, a titanium film, etc.), silicide films obtained by making the metal films into suicides, nitride films obtained by nitriding the metal films (a tantalum nitride film, a tungsten nitride film, a titanium nitride film, etc.) and alloy films obtained by combining those materials. Lamination films in which the thin films listed above are freely combined and layered may also be used.

When the above metal films are employed, it is desirable to take a lamination structure consisting of the metal films and a silicon film in order to prevent oxidation of the metal films. A structure in which the metal films are covered with a silicon nitride film is also effective in preventing the oxidation. In FIG. 1, a protective film 123 comprising a silicon nitride oxide film (an insulating film containing oxygen, nitrogen and silicon at a given ratio) is formed to prevent oxidation of the gate wirings. A silicon oxide film and a silicon nitride film may be used instead of the silicon nitride oxide film. These insulating films are indiscriminately called insulating films containing silicon in this specification.

Reference symbol 124 denotes a first interlayer insulating film that is formed from an insulating film containing silicon (consisting of a single layer or multiple layers). A contact hole is formed in the interlayer insulating film 124, and source wirings 125, 126 and a drain wiring 127 of the CMOS circuit are then formed as well as a source wiring 128 and a drain wiring 129 of the pixel TFT. A passivation film 130 and a second interlayer insulating film 131 are formed thereon and further formed on the films is a shielding film (also referred to as a light-shielding film) 132. A third interlayer insulating film 133 is further formed on the shielding film 132, and a pixel electrode 134 is formed after forming a contact hole.

A resin film having a small relative permittivity is preferably used for the second interlayer insulating film 131 and the third interlayer insulating film 133. As the resin film, a polyimde film, an acrylic resin film, a polyamide film, a BCB (benzocyclobutene) film, etc. may be used. An organic-based SiO compound and SiOF compound may also be used.

A material of the pixel electrode 134 is a transparent conductive film represented by an ITO film if a transmission type AM-LCD is to be manufactured. And it is a metal film of high reflectivity, representative example of which is an aluminum film, if a reflection type AM-LCD is to be manufactured.

Although the pixel electrode 134 is electrically connected through the drain electrode 129 to the drain region 110 of the pixel TFT in FIG. 1, the pixel electrode 134 may be directly connected to the drain region 110.

In the thus structured AM-LCD, the gate insulating film of the driver TFT is thinner than the gate insulating film of the pixel TFT, giving the importance to high-speed operation. On the other hand, the gate insulating film of the pixel TFT is thicker than that of the driver TFT, giving the importance to the gate insulation resistance.

The AM-LCD structured as above is characterized in that the pixel TFT can be formed in a smaller area than in the conventional double gate structure TFT, and in that the degradation of ON current and the increase of OFF current are suppressed at once by a devised arrangement of the LDD regions. In addition, though not shown, the leak current due to leakage of light may be lowered if a shielding film is formed below the active layer of the pixel TFT.

Furthermore, the area occupied by the storage capacitor is reduced by forming a thin dielectric for the storage capacitor to realize, together with the reduced area for the pixel TFT, a pixel portion having a high opening ratio (indicative of effective display region). The dielectric is formed at the same time as the gate insulating films of the driver TFT, so that the number of steps is not increased by formation of the dielectric.

As described above, optimal TFTs are arranged in accordance with the functions of the driver circuit portion, and the pixel portion and the pixel TFT and the storage capacitor are reduced in size, making it possible to manufacture a semiconductor device (including an electrooptical device and an electronic device) that is high in performance and reliability.

The present invention structured as above will be detailed further using Embodiments shown in the following.

Embodiment 1

A description will be made in this embodiment on a manufacturing process to obtain the structure of FIG. 1 explained in the embodiment mode. FIGS. 2A to 4C are referred to.

First, a quartz substrate 202 is prepared as a substrate and an amorphous silicon film 203 is formed thereon. At this point, the amorphous silicon film may be successively formed following the formation of a base insulating film comprising silicon without exposing the film to the air. This can prevent absorption and adhesion of impurities such as boron contained in the air to the lower surface of the amorphous silicon film. (FIG. 2A)

Though an amorphous silicon film is used in this embodiment, other semiconductor films may be used. It may be a microcrystalline silicon film, or an amorphous silicon germanium film. The film is formed to have a final thickness of 25 to 40 nm when the TFT is completed, which is determined by taking into consideration the later thermal oxidation step. In this embodiment, the initial film thickness is set to 65 nm, allowing a thickness loss of 25 nm in the thermal oxidation step.

Next, the amorphous silicon film will be crystallized. This embodiment employs as measures for crystallization a technique disclosed in Japanese Patent Application Laid-open No. Hei 9-312260. The technique disclosed in the publication uses as a catalytic element for promoting crystallization, such as nickel, cobalt, palladium, germanium, platinum, iron, or copper.

In this embodiment, nickel is chosen as the catalytic element, a nickel containing layer (not shown) is formed on the amorphous silicon film 203, and heat treatment is conducted at 550° C. for 4 hours to crystallize the film. A crystalline silicon (polysilicon) film 204 is thus obtained. (FIG. 2B)

The crystalline silicon film 204 may be doped at this point with an impurity element (phosphorus or boron) for controlling the threshold voltage of the TFT. The film may be selectively doped with phosphorus and boron, or may be doped with either one of them.

Following the description of the above publication, a method in which a solution containing nickel is applied onto the amorphous silicon film is adopted in this embodiment. However, sputtering or evaporation methods may be used in forming the nickel containing layer.

Next, a mask film 205 with a thickness of 100 nm is formed from a silicon oxide film on the crystalline silicon film 204. Resist masks 206a, 206b are formed thereon. The mask film 205 is etched using the resist masks 206a, 206b as masks to form openings 207a, 207b.

The film under this state is doped with an element that belongs to group XV in the periodic table (phosphorus, in this embodiment) to form phosphorus doped regions 208a, 208b. The concentration of phosphorus used for the doping is $5\times10^{18}$ to $1\times10^{20}$ atoms/cm$^3$ (preferably $1\times10^{19}$ to $5\times10^{19}$ atoms/cm$^3$). However, the concentration of phosphorus to be used for the doping varies depending on the temperature and time in the later gettering step, and on the area of the phosphorus doped region, and hence is not limited to this range. (FIG. 2C)

The resist masks 206a, 206b are then removed and heat treatment is performed at 450 to 600° C. (preferably 500 to 600° C.) for 2 to 16 hours for gettering of the remaining nickel in the crystalline silicon film. A temperature of the maximum thermal hysteresis ±50° C. is required to obtain the gettering effect. Since the heat treatment for the crystallization is conducted at 550 to 600° C., the heat treatment at a temperature of 500 to 650° C. is enough to obtain the gettering effect.

In this embodiment, nickel is gettered and moved in the direction indicated by the arrow in FIG. 2D to be captured in the phosphorus doped regions 208a, 208b by subjecting the film to a heat treatment of 600° C. for 12 hours; The concentration of the remaining nickel in the crystalline silicon films denoted by 209a, 209b is thus lowered to $2\times10^{17}$ atoms/cm$^3$ or less (preferably $1\times10^{16}$ atoms/cm$^3$ or less). However, this concentration is a measurement result by the secondary ion mass spectroscopy (SIMS), and the concentration less than this can not be confirmed under the present state because of the measurement limit. (FIG. 2D)

After completing the gettering step of nickel in this way, the crystalline silicon films 209a, 209b are patterned to form an active layer (semiconductor layer) 210 for a CMOS circuit and an active layer 211 for a pixel TFT and a storage capacitor. At this point, it is desirable to completely remove the phosphorus doped regions 208a, 208b where the nickel is captured. (FIG. 3A)

A silicon oxide film 212 with a thickness of 110 nm is next formed by plasma CVD, and resist masks 213a to 213d are formed thereon. Subsequently, the film in this state will be doped with an element that belongs to group XV in the periodic table. In this embodiment, impurity regions (referred to as low concentration impurity regions or n$^-$ regions) 214a to 214d containing phosphorus in a concentration of $2\times10^{16}$ to $5\times10^{19}$ atoms/cm$^3$ (preferably $5\times10^{17}$ to $5\times10^{18}$ atoms/cm$^3$) are formed. (FIG. 3B)

In this step, basically, a region to be an NTFT is doped with phosphorus. However, in the NTFT of the CMOS circuit, the resist mask 213a is formed on regions to be a channel forming region and a source region, and the n$^-$ region 214a is formed only in a region to be a drain region. In the pixel TFT, later channel forming regions 216a, 216b are defined by this doping.

The resist masks 213a to 213d are then removed to form new resist masks 217a, 217b. In this state, the film will be doped again with the element that belongs to group XV in the periodic table. Impurity regions (referred to as high concentration impurity regions or n$^+$ regions) 218a, 218b containing phosphorus in a concentration of $5\times10^{19}$ to $3\times10^{21}$ atoms/cm$^3$ (preferably $1\times10^{20}$ to $5\times10^{20}$ atoms/cm$^3$) are formed in this embodiment. (FIG. 3C.)

The n$^+$ region (separation region) 218a formed at this time serves as a region for separating later the channel forming regions from each other under a gate electrode. The n$^+$ region 218b formed at the same time functions as an electrode for the storage capacitor (a first capacitor electrode). This embodiment has an advantage in that the number of steps is not increased because these regions are formed at once.

Further, this step defines LDD regions (regions formed between the channel forming regions 216a and 216b) 219a, 219b of the pixel TFT.

The silicon oxide film 212 is next removed, and an insulating film containing silicon is formed by plasma CVD or sputtering and is patterned to form a gate insulating film 220.

The gate insulating film 220 is to serve as a gate insulating film of the pixel TFT, and a silicon oxide film with a thickness of 60 nm is used for the film 220 in this embodiment. The thickness of the silicon oxide film is determined by taking into consideration the thickness gain in the later thermal oxidation step, so that the final film thickness is 50 to 200 nm (preferably 60 to 120 nm). (FIG. 3D)

The gate insulating film 220 is removed at this point from regions to be the CMOS circuit and the storage capacitor while it remains on the pixel TFT. Though this embodiment explains only for the CMOS circuit, actually, the gate insulating film 220 is removed from a region to be a part of the driver circuit (a circuit that is especially required for high-speed operation). It is therefore desirable to leave an insulating film having the same thickness as the gate insulating film 220 in the case of a circuit where a high voltage is applied to the gate insulating film as in a buffer circuit and a sampling circuit (also called a sample hold circuit).

When the state shown in FIG. 3D is obtained, in this way, the next step is heat treatment at 800 to 1150° C. (preferably 900 to 1100° C.) for 15 minutes to 8 hours (preferably 30 minutes to 2 hours) in an oxidizing atmosphere (thermal oxidation step). In this embodiment, the heat treatment step is conducted in oxygen atmosphere at 950° C. for 30 minutes.

The oxidizing atmosphere may include dry oxygen atmosphere or wet oxygen atmosphere, but dry oxygen atmosphere is suitable to reduce crystal defects in the semiconductor layer. Atmosphere prepared by mixing halogen element in oxygen atmosphere may also be used. The thermal oxidation conducted in this atmosphere containing halogen element is effective, for it also has an effect to remove the nickel used for crystallization.

Through the thermal oxidation step, silicon oxide films (thermal oxide films) 221, 222 with a thickness of 5 to 50 nm (preferably 10 to 30 nm) are formed on the exposed surface of the semiconductor layer in the regions to be the driver TFT and the storage capacitor. In this embodiment, silicon oxide films each having a thickness of 50 nm are formed and the silicon oxide film 221 is used as a gate insulating film of the driver TFT while the silicon oxide film 222 is used as a dielectric of the storage capacitor.

The oxidation reaction proceeds also in the interface between the gate insulating film 220, which comprises silicon oxide and is left in the pixel TFT, and the semiconductor layer under the film 220. Therefore, the final film thickness of the gate insulating film 223 of the pixel TFT is, adding the initial thickness of the insulating film, 60 nm to the thickness of the insulating film formed by the thermal oxidation, 50 nm, 110 nm in total. About 25 nm of semiconductor layer is oxidized through this thermal oxidation step, changing the thickness of the active layers 210, 211 to 40 nm. This is the final film thickness for the active layers of the completed TFT.

When the thermal oxidation step is completed in this way, gate electrodes 224 (on the NTFT side), 225 (on the PTFT side) of the driver TFT and a gate electrode 226 of the pixel TFT, an electrode (second capacitor electrode) 227 of the storage capacitor are formed. (FIG. 3E)

This embodiment uses as the gate electrodes 224 to 226 and the second capacitor electrode 227 a lamination film consisting of the lowermost layer of silicon film (having conductivity), the middle layer of tungsten nitride film, and the uppermost layer of tungsten film (or consisting of a lower layer of silicon film and an upper layer of tungsten silicide film). Needless to say, the other conductive films mentioned in the embodiment mode may also be used. The thickness of each gate wiring is set to 400 nm in this embodiment.

The lowermost silicon film is formed by low pressure thermal CVD in this embodiment. The gate insulating film of the driver circuit is as thin as 5 to 50 nm, so that the use of sputtering or plasma CVD might cause damage to the semiconductor layer (active layer) depending on conditions. Therefore, thermal CVD in which the film is formed through a chemical vapor phase reaction is preferred.

Next, resist masks 229a, 229b are formed and the film is doped again with an element that belongs to group XV in the periodic table (phosphorus, in this embodiment). The concentration of phosphorus used for this doping is the same as the phosphorus concentration used in the doping step of FIG. 3C. (FIG. 4A)

This step may be divided into a part where the thin gate insulating film of the driver TFT is doped and a part where the thick gate insulating film of the pixel TFT is doped, or may not be divided but conducted at once. The phosphorus doping step may employ ion implantation accompanying mass separation, or plasma doping that does not accompany mass separation. Conditions such as acceleration voltage and dose may be set to optimal values by a person who carries out the invention.

Through this step, a source region 230, a drain region 231, an LDD region 232, and a channel forming region 233 of the NTFT in the CMOS circuit are defined. A source region 234, a drain region 235 and LDD regions 236a, 236b of the pixel TFT are also defined.

At this point, the LDD regions 236a, 236b are formed so as to partially overlap with the gate electrode 226 with the gate insulating film 223 interposed therebetween. This arrangement provides a structure strong against the degradation caused by hot carrier injection. A portion of the LDD regions 236a, 236b which does not overlap with the gate electrode 226 has a great effect in preventing the increase of OFF current.

In this embodiment, of the LDD regions 236a, 236b that are in contact with the source region 234 and the drain region 235, respectively, the portion overlapping with the gate electrode 226 extends to a length (width) of 0.3 to 2.0 µm (preferably 0.5 to 1.5 µm), and the portion not overlapping with the gate electrode extends to a length (width) of 1.0 to 4.0 µm (preferably 2.0 to 3.0 µm).

Next, regions except for a region to be the PTFT of the CMOS circuit are hidden under resist masks 237, 238 and the region is doped with an element that belongs to group XIII in the periodic table (boron, in this embodiment). The concentration of boron used for the doping is adjusted in this embodiment to $3\times10^{20}$ to $3\times10^{21}$ atoms/cm$^3$. (FIG. 4B)

Needles to say, this step also may employ ion implantation accompanying mass separation, or plasma doping that does not accompany mass separation. Conditions such as acceleration voltage and dose may be set to optimal values by a person who carries out the invention.

Through this step, a source region 239, a drain region 240, and a channel forming region 241 of the PTFT for forming the CMOS circuit are defined. A drain region 242 of the NTFT in the CMOS circuit is also defined.

After thus forming all the impurity regions, the resist masks 237, 238 are removed. A protective film 243 having a thickness of 200 mn and comprising a silicon nitride oxide film is formed to cover the gate electrodes 224 to 226 and the second capacitor electrode 227. The protective film 243 has an effect of preventing oxidation of the gate electrodes 224 to 226 and the second capacitor electrode 227. Other insulating film containing silicon may be used for the protective film 243.

When the protective film 243 is formed, a heat treatment step is conducted at a temperature range of from 600° C. to 1000° C. (preferably from 600° C. to 850° C.) for 20 minutes to 12 hours. Heat treatment in this embodiment is performed at 800° C. for an hour in inert atmosphere. Through this step, the impurity element used for the doping is activated and the silicon film made amorphous is again crystallized.

Hydrogenation treatment follows the activation. The hydrogenation treatment is a treatment for adding hydrogen excited by heat treatment or plasma treatment, and if hydrogen is excited by heat treatment, the film is subjected to heat treatment in atmosphere containing 3 to 100% of hydrogen at 300 to 450° C. for 2 to 6 hours.

A first interlayer insulating film 244 is next formed. This embodiment uses a silicon oxide film having a thickness of 800 nm and formed by plasma CVD. A contact hole is formed and, then, source wirings 245 to 247 and drain wirings 248, 249 are formed. In this embodiment, these films are formed from a lamination film in which a conductive film mainly containing aluminum is sandwiched between titanium films.

The aforementioned hydrogenation treatment may be conducted after forming the source wirings and the drain wirings. In any case, the formation of the source wirings and the drain wirings is followed by formation of a passivation film 250. For the passivation film 250, a silicon nitride film, a silicon oxide nitride film, a silicon nitride oxide film, or a lamination film of-these insulating films and a silicon oxide film may be used. A silicon nitride film with a thickness of 300 nm is used as the passivation film in this embodiment.

As a pretreatment for forming the silicon nitride film, in this embodiment, plasma treatment using ammonium gas is conducted to directly form the passivation film 250. The hydrogen activated (excited) by plasma is confined through this pretreatment within the first interlayer insulating film 244, facilitating the hydrogen termination in the active layer (semiconductor layer) of the TFT.

After the passivation film 250 is formed,-heat treatment is performed at 350 to 450° C. The heat treatment is for improving the film quality of the passivation film 250 and, at the same time, for moving the hydrogen added into the first interlayer insulating film in the aforementioned hydrogenation to a lower layer by thermal diffusion, effectively hydrogenating the active layer. The heat treatment itself may of course be conducted in atmosphere containing hydrogen.

Next, an acrylic film with a thickness of 1 µm is formed as a second interlayer insulating film 251. Instead of the acrylic film, organic-based resin films such as a polyimide film, a polyamide film, a polyimideamide film and a BCB (benzocyclobutene) film may be used. These resin films are effective for their low relative permittivity and high flatness.

Then a metal film with a thickness of 200 nm is formed thereon and patterned to form a shielding film 252. In this embodiment, a titanium film or a lamination film of an titanium film and an aluminum film is used as the shielding film 252.

A third interlayer insulating film 253 with a thickness of 1 µm is then formed from an organic-based resin material, similar to the second interlayer insulating film 251. The third interlayer insulating film 253, the second interlayer insulating film 251, and the passivation film 250 are etched in order, and a contact hole reaching the drain wiring 249 is formed to form a pixel electrode 254. A material of the pixel electrode 254 is a transparent conductive film if a transmission type AM-LCD is to be manufactured, and it is a metal film if a reflection type AM-LCD is to be manufactured. A transmission type AM-LCD is intended in here, so that an indium tin oxide (ITO) film with a thickness of 100 nm is formed by sputtering.

In an AM-LCD of the present invention, the thickness of the gate insulating films is different between the driver circuit portion (or other logic circuit portion) and the pixel portion which are formed on the same insulator. Typically, the driver TFT used for the driver circuit has a thinner gate insulating film than the pixel TFT used for the pixel portion has.

The AM-LCD of the present invention is also characterized in that the gate insulating film of the driver TFT and the dielectric of the storage capacitor provided in the pixel portion are formed at once to simplify the process. In this case, the gate insulating film of the driver TFT and the dielectric of the storage capacitor have the same thickness.

As described above, the present invention is characterized in that the step of forming a thin gate insulating film for the driver TFT also serves as the step of forming a thin dielectric for the storage capacitor. With the structure as such, the capacity of the storage capacitor may be increased without enlarging the area thereof.

When following the manufacturing process of this embodiment, the final active layer (semiconductor layer) of the TFT comprises a crystalline silicon film having a specific crystal structure in which crystal lattices have continuity. Here, a crystalline silicon film is experimentally formed by following the manufacturing process of this embodiment, and the analysis result of the thus formed film will be explained below.

A first feature of the crystalline silicon film formed in accordance with the manufacturing process of this embodiment is that it has a crystal structure in which a plurality of needle-like or rod-like crystals (hereinafter abbreviated as rod-like crystals) are gathered and aligned when viewed microscopically. This may readily be confirmed through observation using TEM (transmission electron microscopy).

A second feature of the crystalline silicon film formed in accordance with the manufacturing process of this embodiment is that {110} plane, which is an orientated film whose crystal axis is more or less shifted, is observed by electron diffraction on its surface (where a channel is to be formed). This can be confirmed from the fact that the diffraction spots having regularity unique to {110} plane are found through an electron diffraction photograph with a spot diameter of 1.35 µm. It is also confirmed that the spots are distributed on a concentric circle.

A third feature of the crystalline silicon film formed in accordance with the manufacturing process of this embodiment is that the orientation ratio of {220} plane is 0.7 or more (typically 0.85 or more) according to the confirmed result of X-ray diffraction (specifically, X-ray diffraction using the θ-2θ method) for calculating the orientation ratio. For the calculation of the orientation ratio, a method disclosed in Japanese Patent Application Laid-open No. Hei 7-321339 is used.

A fourth feature of the crystalline silicon film formed in accordance with the manufacturing process of this embodiment is that continuity is recognized in crystal lattices in a crystal grain boundary from HR-TEM (high resolution transmissive electron microscopy) observation performed by the present inventors on the crystal grain boundary formed from rod-like crystals that are brought into contact with one another. This is easily confirmed by the fact that lattice stripes observed are continuously connected in the crystal grain boundary.

The continuity of the crystal lattices in the crystal grain boundary is originated in that the crystal grain boundary is a grain boundary called 'planar grain boundary'. The definition of the term planar grain boundary in this specification agrees with the 'planar boundary' described in "Characterization of High-Efficiency Cast-Si Solar Cell Wafers by MBIC Measurement", Ryuichi Shimokawa and Yutaka Hayashi, Japanese Journal of Applied Physics, vol. 27, No. 5, pp. 751-758, 1988.

According to the above article, the planar boundary includes a twin grain boundary, a special stacking fault, a special twist grain boundary, etc. The planar boundary is characterized by being electrically inert. In other words, it may practically be regarded as nonexisting because it does not function as a trap that inhibits movement of carriers in spite of being a crystal grain boundary.

When the crystal axis (axis that is perpendicular to the crystal plane) is <110> axis, in particular, {211} twin grain boundary is also called a corresponding grain boundary of Σ3. The Σ value is a parameter serving as an indicator showing the degree of alignment in a corresponding boundary, and it is known that a grain boundary of smaller Σ value is a grain boundary showing better alignment. For instance, a crystal grain boundary formed between two crystal grains both of which have a plane orientation of {110} is known to make a corresponding grain boundary of Σ3 when an angle θ, which is formed by lattice stripes corresponding to the {111} planes, is 70.5°.

When an HR-TEM observation is performed on a crystal grain boundary formed between two crystal grains whose crystal axes are each <110> in the crystalline silicon film obtained by carrying out this embodiment, it is found that lattice stripes are continuous at an angle of about 70.5° in many adjacent crystal grains. Therefore it is inferred that the crystal grain boundary is a corresponding grain boundary of Σ3, namely, a {211} twin grain boundary.

The crystal structure as such (the structure of the crystal grain boundary, to be strict) indicates that different two crystal grains are connected in a very well aligned manner in the crystal grain boundary. That is, the crystal lattices are continuously connected in the crystal grain boundary, so that a trap level caused by crystal defect or the like is hardly formed. Therefore a semiconductor thin film having such a crystal structure may be considered that it has practically no crystal grain boundary.

The TEM observation further verifies that most of the defects that have been present in crystal grains are eliminated by a heat treatment step at a high temperature of 700 to 1150° C. (the thermal oxidation step, in this embodiment). This is also apparent from the fact that the defects are greatly decreased in number after the heat treatment step compared with the defects before the step.

This difference in the number of defects can be recognized as the difference in spin density in Electron Spin Resonance (ESR) analysis. Under the present circumstances, it has been found that the crystalline silicon film formed in accordance with the manufacturing process of this embodiment has a spin density of at least $5 \times 10^{17}$ spins/cm$^3$ or less (preferably $3 \times 10^{17}$ spins/cm$^3$ or less). However, this measured value is near the detection limit of existing measurement devices, and hence the actual spin density of the film is expectedly even lower.

From the facts stated above, the crystalline silicon film obtained by carrying out this embodiment, having practically no crystal grain boundary, may be regarded as a monocrystal silicon film or an essentially monocrystal silicon film.

Embodiment 2

In this embodiment, a specific description will be given with reference to FIG. 5 as to which portion needs which TFT to be placed.

In an AM-LCD, the minimal operation voltage (supply voltage) required is different between different portions. For instance, the pixel portion requires as high operation voltage as 14 to 20 V when taking into account the voltage applied to the liquid crystal and the voltage for driving the pixel TFT. Therefore it is necessary to use a TFT that can withstand when so high a voltage is applied.

On the other hand, an operation voltage of about 5 to 10 V is enough for the shift resister included in the source driver circuit and the gate driver circuit. A circuit that requires lower operation voltage has more compatibility with an external signal and can suppress its power consumption further, which are advantageous. The above TFT to be used in the pixel portion is not suitable for a circuit required to operate at a high speed such as the shift resister, for the operation speed is sacrificed to good withstand voltage characteristic in the above TFT.

Thus, the TFTs formed on the substrate are divided depending on the purpose into two kinds: one is required for withstand voltage characteristic and the other is required for high-speed operation characteristic.

Figure 5:
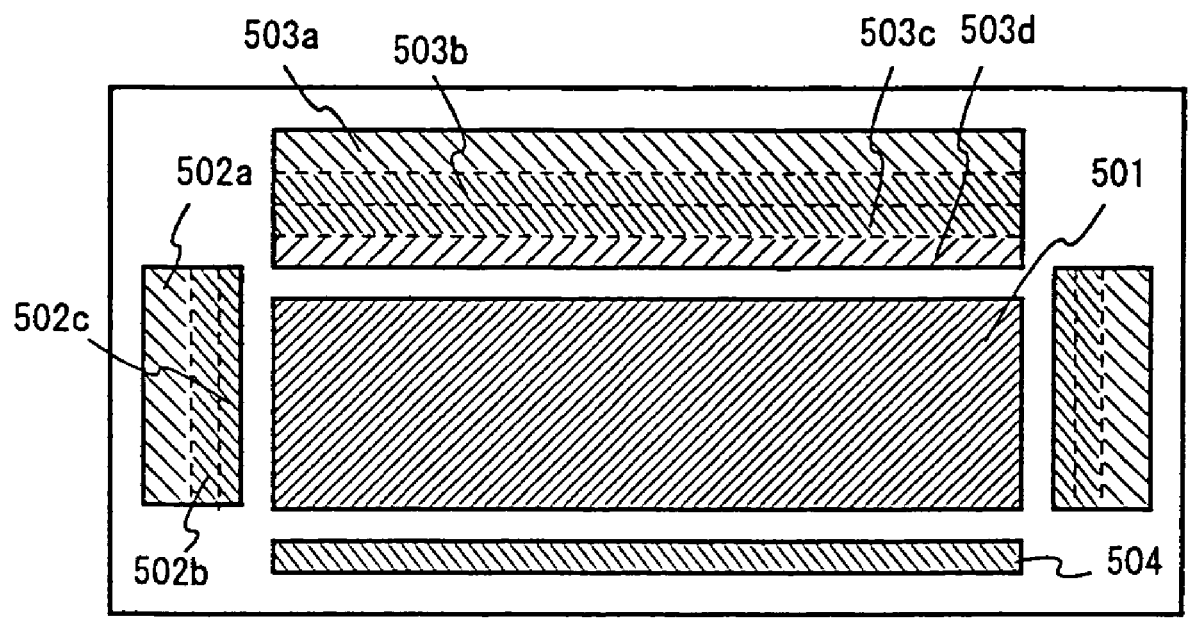
FIG. 5 is a block diagram showing an active matrix substrate.

Here, the structure of this embodiment is concretely shown in FIG. 5 and FIGS. 6A to 6D. Shown in FIG. 5 is a block diagram of an AM-LCD viewed from its top. Reference symbol 501 denotes a pixel portion that functions as an image display region. Reference symbol 502a denotes a shift resister, 502b, a level shifter, and 502c, a buffer. These circuits form a gate driver circuit as a whole.

In the AM-LCD shown in FIG. 5, the gate driver circuit is formed so as to sandwich the pixel portion, and the left and right sections of the gate driver circuit share a gate wiring. That is, the gate driver circuit is formed to have redundancy so that the voltage can be applied to the gate wiring even when a defect is caused in one of the sections of the gate driver circuit.

Reference numeral 503a denotes a shift register, 503b, a level shifter, 503c, a buffer, and 503d, a sampling circuit, which form a source driver circuit as a whole. The source driver circuit is provided on one side of the pixel portion, whereas a precharge circuit 504 is formed on the other side.

In the AM-LCD including the structures as such, the shift registers 502a, 503a are circuits that are required for high-speed operation, and the operation voltage thereof is as low as 3.3 to 10 V (typically 3.3 to 5 V). The high withstand voltage characteristic is not particularly required of these circuits. Accordingly, the thickness of the gate insulating film of the circuits are preferred to be thin within a range of 5 to 50 nm (preferably 10 to 30 nm).

Figure 6A:
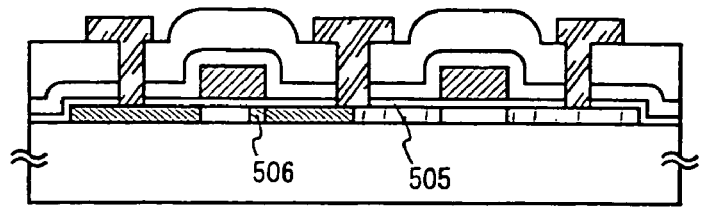
FIGS. 6A to 6D are views showing the sectional structure of portions of an active matrix substrate.

Shown in FIG. 6A is a schematic diagram of a CMOS circuit to be used mainly for a circuit required for high-speed operation, such as a shift register and other logic circuits. In FIG. 6A, denoted by 505 is a gate insulating film of an NTFT and a PTFT, and the thickness thereof is designed as thin as 5 to 50 nm (preferably 10 to 30 nm).

Reference symbol 506 denotes an LDD region that overlaps with a gate electrode with the gate insulating film interposed therebetween and has an effect of preventing degradation of the ON current value due to hot carrier injection. The length of the LDD region 506 is preferably 0.3 to 2 μm (typically 0.5 to 1.5 μm). The LDD region here is provided only on the drain region side. It is sufficient if at least the drain region side has the LDD region. The LDD region may not be provided when the operation voltage is sufficiently low, say 2 to 3 V.

Figure 6B:
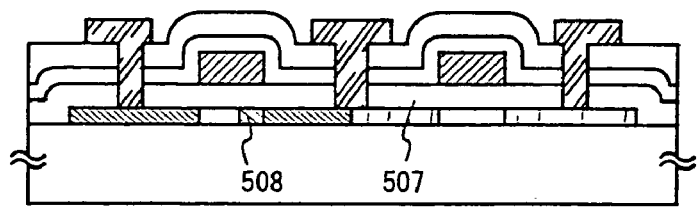

A CMOS circuit shown in FIG. 6B is suitable mainly for the level shifters 502b, 503b, the buffers 502c, 503c and the precharge circuit 504. These circuits need relatively large current to be flown therethrough, requiring an operation voltage as high as 14 to 16V. In particular, a high operation voltage of 19 V may be needed on the gate driver side in some cases. A TFT having a very good withstand voltage characteristic (high withstand voltage characteristic) is thus required.

In the CMOS circuit shown in FIG. 6B at this point, a gate insulating film 507 is designed to have a thickness of 50 to 200 nm (preferably 100 to 150 nm). In this way, the gate insulating film of the circuit required for the high withstand voltage characteristic is preferably (3 to 10 times) thicker than the gate insulating film of the TFT such as the shift register circuit shown in FIG. 6A.

Reference symbol 508 denotes an LDD region that overlaps with a gate electrode with the gate insulating film interposed therebetween and has an effect of preventing degradation of the ON current value due to hot carrier injection. The length of the LDD region 508 is preferably 0.5 to 2.0 μm (typically 1.0 to 1.5 μm). In this case also, it is sufficient if at least the drain region side has the LDD region.

Figure 6C:
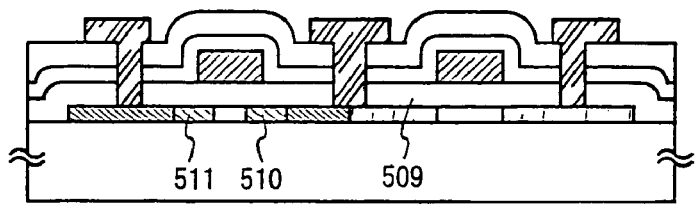

A circuit shown in FIG. 6C is suitable mainly for the sampling circuit (also referred to as an analogue switch) 503d. The sampling circuit also is required for good withstand voltage and therefore a gate insulating film 509 of an NTFT and a PTFT is designed to have a thickness of 50 to 200 nm (preferably 100 to 150 nm).

In the case of the sampling circuit 503d, the functions of a source region and a drain region are inverted, requiring to form LDD regions on both sides of a channel forming region so as to sandwich the channel forming region. Furthermore, it is preferable not only to take countermeasures against hot carriers but also to lower the OFF current value. LDD regions 510, 511 are therefore arranged, as in a pixel TFT, on both sides of the channel forming region to form a region that overlaps with a gate wiring and a region that does not. In this case, the length of the LDD region that overlaps with the gate wiring is set to 0.3 to 2 μm (typically 1.0 to 1.5 μm), and the LDD region that does not overlap with the gate wiring is set to 1.0 to 2.5 μm (preferably 1.5 to 2.0 μm).

Figure 6D:
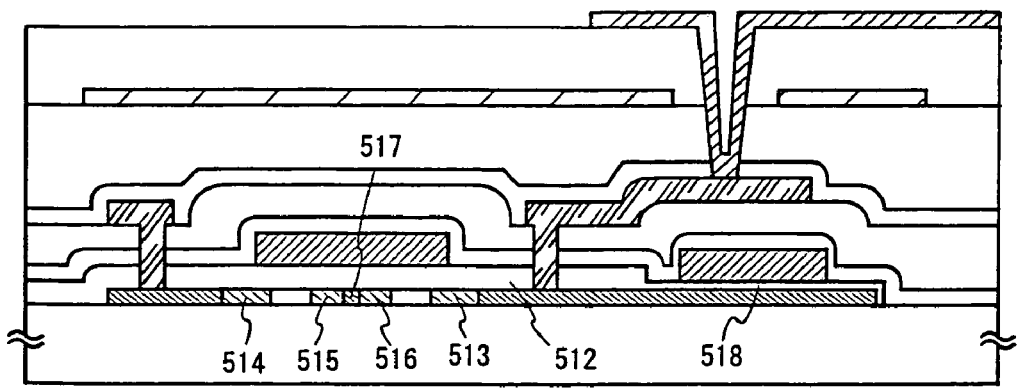

FIG. 6D shows a schematic diagram of one pixel of the pixel portion 501. The pixel TFT needs an operation voltage of 14 to 16 V, for the voltage applied to the liquid crystal is added thereto. Also, the pixel TFT has to hold for one frame term electric charges charged in the liquid crystal and a storage capacitor, and hence the OFF current must be as small as possible.

For those reasons, an NTFT is used and the thickness of a gate insulating film 512 is set to 50 to 200 nm (preferably 100 to 150 nm) in this embodiment. This film thickness may be or may not be the same as that of the CMOS circuits shown in FIGS. 6B, 6C.

LDD regions 513, 514 are formed so as to partially overlap with a gate electrode with a gate insulating film interposed therebetween. At this point, of the LDD regions 513, 514, the length (width) of a portion that overlaps with the gate electrode is set to 0.3 to 2.0 μm (typically 0.5 to 1.0 μm), and the length (width) of a portion that does not overlap with the gate electrode is set to 1.0 to 4.0 μm (preferably 2.0 to 3.0 μm). The length (width) of n⁻ regions 515, 516 that are arranged under the gate electrode is set to 0 to 2.0 μm (typically 0.5 to 1.5 μm).

An n⁺ region (separation region) 517 that is arranged under the gate electrode functions as a region for preventing the movement of a hole that is a minority carrier. Therefore a great effect is obtained in reducing the OFF current value. This region provides the effect of reducing the OFF current value by its sheer presence, and becomes even more effective in reducing the OFF current value when it has a thickness of 1 to 5 μm (preferably 2 to 3 μm).

At the same time, a dielectric 518 of a storage capacitor has the same thickness as the gate insulating film of the CMOS circuit shown in FIG. 6A, i.e., 5 to 50 nm (preferably 10 to 30 nm). The dielectric may of course be formed by oxidizing an active layer, or by CVD or sputtering.

As described above, also in the AM-LCD taken as an example, various circuits and elements are formed on the same insulator and the required operation voltage (supply voltage) might vary between the circuits and the elements. If it is the case, discriminating use of TFTs is necessary, as in the present invention, in which TFTs different from each other in gate insulating film thickness are arranged appropriately.

The manufacturing process of Embodiment 1 may be used upon carrying out this embodiment. Conversely, it is effective to apply the numeric value range in this embodiment when practicing the manufacturing process of Embodiment 1.

Embodiment 3

Figure 7:
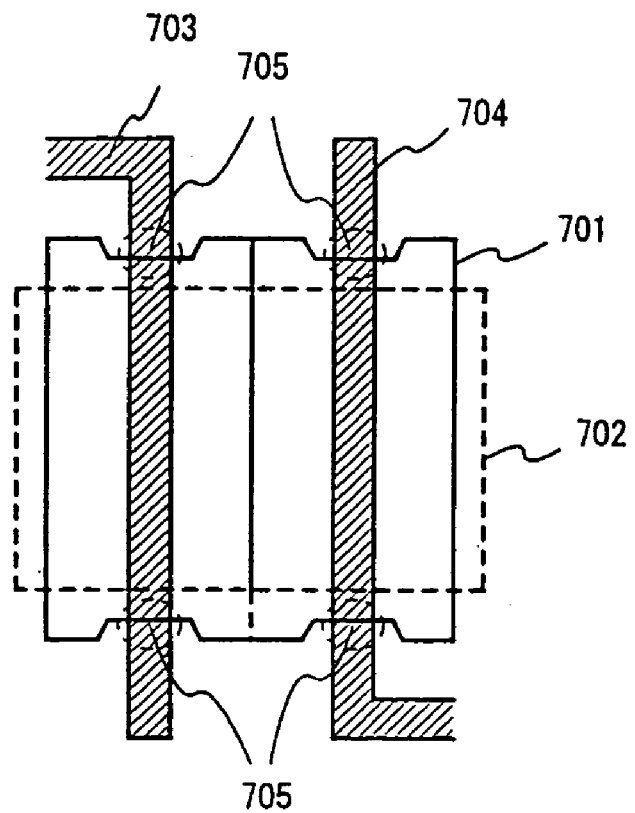
FIG. 7 is a view showing the structure of a driver TFT (CMOS circuit)

At the step of selectively removing the insulating film 220 in Embodiment 1, desirable removal in regions to be the driver TFT and the storage capacitor is conducted as illustrated in FIG. 7. In FIG. 7, reference numeral 701 denotes an active layer, 702, an end portion of the gate insulating film 220, and 703, 704, gate wirings. As shown in FIG. 7, in portions 705 where the gate wirings overstep the active layer, it is desirable to leave the insulating film 220 at an end portion of the active layer 701. Here, the inside of a region surrounded by the one dot dashed line is a region where the insulating film 220 is removed.

A phenomenon called edge thinning takes place at the end portion of the active layer 701 when the thermal oxidation step is conducted later. This is a phenomenon in which oxidation reaction advances as if it crawls under the active layer end portion, and the reaction causes the end portion to swell upward as soon as it reaches an area where the end portion is thin. The edge thinning phenomenon thus brings about a problem in that the gate wirings are likely to be broken overstepping the active layer.

However, by removing the insulating film 220 to obtain the structure as shown in FIG. 7, the edge thinning phenomenon can be prevented from occurring at the portions 705 where the gate wirings overstep the active layer. Therefore problems such as breakage of the gate wirings can be avoided.

Embodiment 4

In this embodiment, a description will be made with reference to FIGS. 8A to 8C and FIG. 9 on a case where an AM-LCD is manufactured by a different process from the one in Embodiment 1.

An amorphous silicon film (not shown) is first formed on a quartz substrate 202, following the manufacturing steps of Embodiment 1. Then, after the amorphous silicon film is crystallized, active layers 203, 204 comprising the crystalline silicon film are formed.

Upon formation of the active layers, as shown in FIG. 8A, resist masks 801 to 803 are formed on the active layers and doped with an element that belongs to group XV in the periodic table (phosphorus, in this embodiment). Regions doped with phosphorus (hereinafter referred to as phosphorus doped regions) 804 to 809 are formed in this way.

It is preferable to oxidize the surfaces of the active layers prior to formation of the resist masks 801 to 803. Forming a silicon oxide film prevents contamination of the active layers caused by an organic, as well as enhances the adherence between the active layers and the resist masks.

The resist masks 801, 802 are formed on the active layer of a driver TFT, and arranged such that a part of a region (or the entire region) to be a source region or a drain region is exposed. On the other hand, the resist mask 803 is arranged so as to expose a part of a drain region or a source region of a pixel TFT (or the entire drain region or source region of the pixel TFT), and a region later to be a corresponding region to the n⁺ region (separation region) 517 in Embodiment 1. At this point, a region denoted by 808 later becomes the corresponding region to the separation region 517 while a region denoted by 809 later becomes a first capacitor electrode.

The concentration of phosphorus used for the doping is preferably $5 \times 10^{18}$ to $1 \times 10^{20}$ atoms/cm³ (desirably $1 \times 10^{19}$ to $5 \times 10^{19}$ atoms/cm³). However, the concentration of phosphorus to be used for the doping varies depending on the temperature and time of a later gettering step and on the area of the phosphorus doped region, and is not limited to this range.

Next, the resist masks 801 to 803 are removed, and heat treatment is conducted at 500 to 650° C. for 2 to 16 hours to getter a catalytic element (nickel, in this embodiment) used for crystallizing the silicon film. In order to obtain the gettering effect, a temperature of the maximum thermal hysteresis ±50° C. is required. Since the heat treatment for the crystallization is conducted at 550 to 650° C., the heat treatment at a temperature of 500 to 600° C. is enough to obtain the gettering effect.

In this embodiment, nickel is gettered and moved in the direction indicated by the arrow to be captured in the phosphorus doped regions by subjecting the film to a heat treatment of 600° C. for 12 hours. Gettering regions 810 to 815 are thus formed. The gettering regions 810 to 813 are remained as parts of the source region or the drain region of the TFT (or the entire source region or drain region of the TFT), the gettering region 814 is remained as the corresponding region to the n+region 517 in Embodiment 1, and the gettering region 815 is remained as the first capacitor electrode. (FIG. 8B)

When the gettering step shown in FIG. 8B is completed, a gate insulating film (not shown) is formed and patterned to form a gate insulating film 220 of the pixel TFT. The subsequent steps follows the steps in Embodiment 1, and hence the description thereof is omitted.

Figure 9:
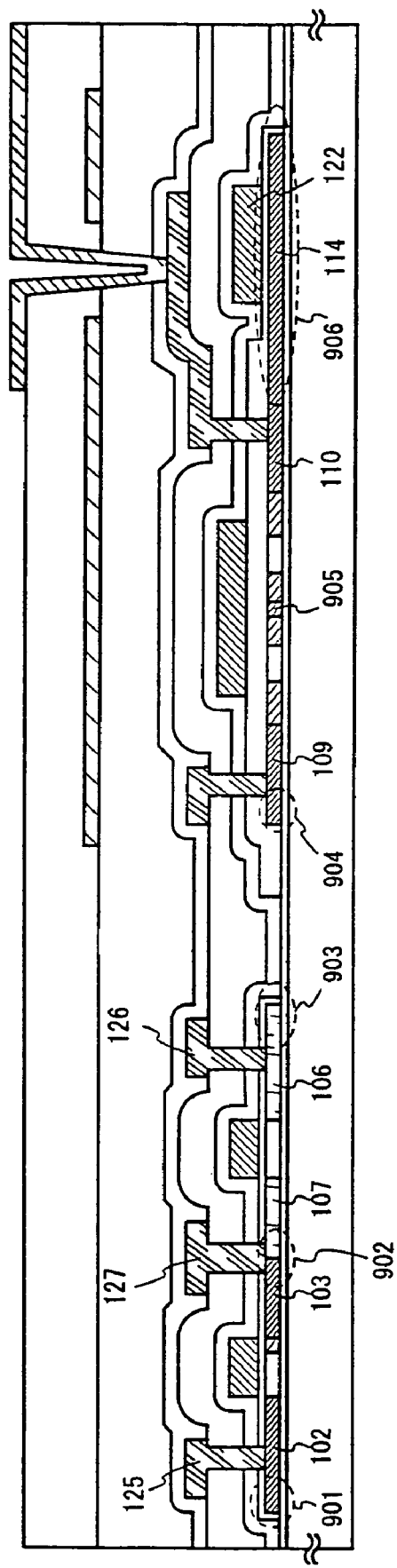
FIG. 9 is a view showing the sectional structure of an active matrix substrate.

The AM-LCD shown in FIG. 9 is completed as above. The sectional structure of the AM-LCD shown in FIG. 9 is the same as the sectional structure of the AM-LCD shown in FIG. 1. The difference of this embodiment from Embodiment 1 is that nickel containing regions 901 to 903 are present in a part of source regions 102, 106 and drain regions 103, 107 of the driver circuit.

The nickel containing regions 901 to 903 contain nickel in a concentration of $1 \times 10^{19}$ atoms/cm³ or more (typically $3 \times 10^{19}$ to $1 \times 10^{21}$ atoms/cm³). However, nickel does not present an unstable factor for the TFT characteristics since nickel exists in a stable state as, for example, nickel silicide.

In this embodiment (FIG. 9), a contact portion where a drain wiring 127 is in contact with the drain region 103 of an NTFT and with the drain region 107 of a PTFT coincides with the nickel containing region 902. Such a structure can provide good ohmic contact owing to the presence of the nickel, which is a metal.

In FIG. 9, the source region 102 is in contact with a source wiring 125 (or the source region 106 with a source wiring 126) without interposing the nickel containing region therebetween. Needless to say, however, the source region and the source wiring may be in contact with each other while interposing the nickel containing region as in the case of the drain wiring.

The same can be applied to the source region 109 and the drain region 110 of the pixel portion. A part of these region also includes nickel containing regions (904, 906). An n⁺ region (separation region) 905 contains phosphorus in the same concentration as the source region and the drain region do, but the n⁺ region 905 is merely a passage for electrons that are majority carriers, so that the presence of nickel does not cause any problem.

Another feature of this embodiment is that a first capacitor electrode 114 contains phosphorus in a concentration of $5 \times 10^{18}$ to $1 \times 10^{20}$ atoms/cm³ (preferably $1 \times 10^{19}$ to $5 \times 10^{19}$ atoms/cm³), and contains nickel in a concentration of $1 \times 10^{19}$ atoms/cm³ or more (typically $3 \times 10^{19}$ to $1 \times 10^{21}$ atoms/cm³). That is, it can be used as the electrode as it is without applying voltage to a second capacitor electrode 122, which is effective in reducing power consumption of the AM-LCD.

As seen in the above, it is given as the feature of the manufacturing process of this embedment that the phosphorus doping step for gettering also serves as the phosphorus doping step for imparting conductivity to a lower electrode of the storage capacitor. This makes it possible to reduce power consumption without increasing the number of manufacturing steps.

Incidentally, the structure of this embodiment may freely be combined with any of the structures of Embodiments 1 to 3.

Embodiment 5

In the manufacturing step of FIG. 8A in Embodiment 4, a gate insulating film for a pixel TFT may be formed to cover the active layer (this corresponds to the state of the gate insulating film 220 before being patterned) prior to the formation of the resist masks 801 to 803.

The phosphorus doping step of FIG. 8A is accordingly modified to through doping in which the element is injected piercing through the gate insulating film having a thickness of 50 to 200 nm. After removing the resist masks 801 to 803, the gettering step is performed while the active layer is covered with the gate insulating film. When the gettering step is ended, the gate insulating film is patterned to form the same structure as the one in FIG. 8C.

An advantage of this embodiment is that the active layer is not exposed during the gettering step. If the active layer is exposed, phosphorus present in the phosphorus doped regions 804 to 809 may be diffused into the atmosphere depending on conditions such as the treatment temperature and the treatment atmosphere, undesirably doping a region to be the channel forming region. However, the problem as such can be avoided when the active layer is covered with the gate insulating film as in this embodiment.

Incidentally, the structure of this embodiment may freely be combined with any of the structures of Embodiments 1 to 3. The features of the final completed AM-LCD is the same as those described in Embodiment 4 and illustrated in FIG. 9, and hence the explanation thereof is omitted.

Embodiment 6

This embodiment gives a description on a case where a TFT is formed on a substrate in accordance with the manufacturing process shown in Embodiment 1 to actually fabricate an AM-LCD.

When the state shown in FIG. 4C is obtained, an orientated film with a thickness of 80 nm is formed on the pixel electrode 254. Next, as an opposite substrate, a glass substrate on which a color filter, a transparent electrode (opposite electrode), and an orientated film are formed is prepared. Each orientated film is subjected to rubbing treatment, and the substrate on which the TFT is formed is bonded to the opposite substrate using a sealing material. Then liquid crystal is injected between the substrates. This cell assembling step may employ known measures, and detailed explanation thereof is omitted.

Incidentally, a spacer for keeping the cell gap may be provided if necessary. Therefore it is not particularly needed to provide the spacer when the cell gap can be kept without using the spacer as in an AM-LCD whose diagonal angle is 1 inch or less.

Figure 10:
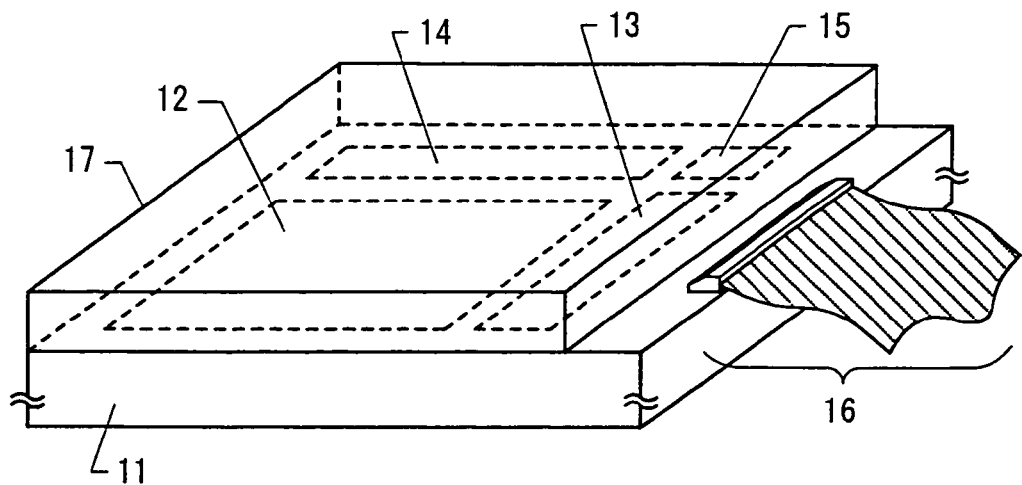
FIG. 10 is a view showing the exterior of an AM-LCD.

The exterior of the AM-LCD fabricated as above is shown in FIG. 10. On an active matrix substrate (that designates the substrate of FIG. 4C on which TFT is formed) 11, a pixel portion 12, a driver circuit (a source driver circuit 13, a gate driver circuit 14), and a logic circuit other than the pixel portion and the driver circuit (a signal divider circuit, a D/A converter circuit, a γ0 correction circuit or a differential amplifier circuit) 15 are formed. An FPC (flexible printed circuit) 16 is attached to the active matrix substrate 11. The opposite substrate is denoted by 17.

The TFTs for constituting the above pixel portion and the driver circuit is formed in accordance with the manufacturing step of Embodiment 1. To arrange a suitably structured TFT to a suitable portion, the description of Embodiment 1 will be of help. Incidentally, the structure of this embodiment may freely be combined with any of the structures of Embodiments 1 to 5.

Embodiment 7

Figure 11:
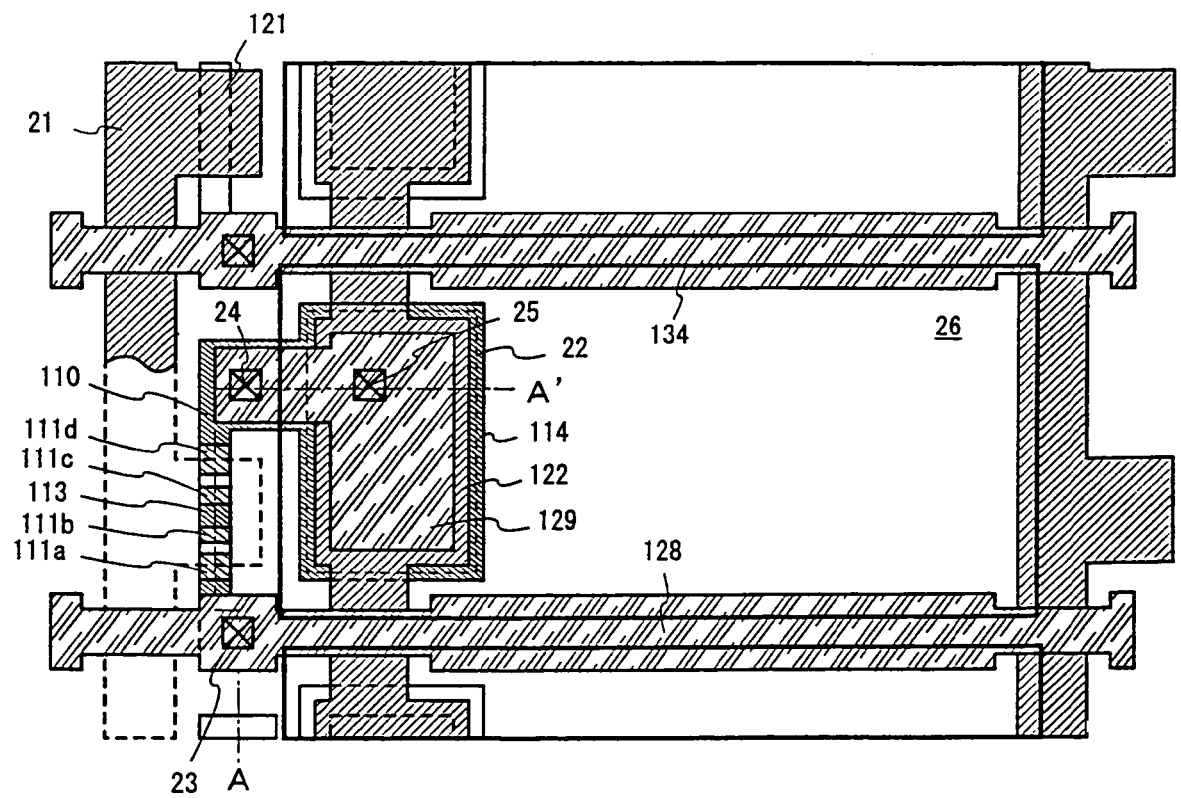
FIG. 11 is a view showing the top structure of a pixel.

This embodiment will be described with reference to FIG. 11 showing a top view of one pixel in the pixel portion of the active matrix substrate shown in FIG. 1. The sectional structure shown in FIG. 1 corresponds to the sectional view taken along the dotted and dashed line A-A'. Accordingly, the description relating to FIG. 1 can be referred as it is with respect to the parts in FIG. 11 which is denoted by the same reference symbols as those in FIG. 1.

Reference symbol 21 designates a gate wiring and 121 denotes a portion where the gate wiring overlaps with an active layer. The portion denoted by 121 is referred to as a gate electrode in FIG. 1. A region denoted by 22 and surrounded by the dotted line is a region where the first capacitor electrode 114 and a capacitor wiring 122 overlap with each other through a dielectric (not shown) interposed therebetween to form a storage capacitor.

Reference symbol 23 designates a contact portion between the source region 109 and the source wiring 128, 24, a contact portion between the drain region 110 and the drain wiring 129, and 25, a contact portion between the drain wiring 129 and the pixel electrode 134. Denoted by 26 is an image display region.

In comparison with the case of using a conventional double gate structure (in which two TFTs are connected in series) pixel TFT, the use of the pixel TFT of the present invention makes it possible to reduce the occupied area of the pixel TFT for one pixel, thereby increasing the opening ratio (ratio of the occupied area of the image display region to the area of one pixel).

The structure of this embodiment shown in FIG. 11 can be obtained by following the manufacturing process described in Embodiment 1. Any of the structures. of Embodiments 3 to 5 may be combined with the structure of Embodiment 1.

Embodiment 8

The present invention may also be applied to the case where an interlayer insulating film is formed on a conventional MOSFET to form a TFT thereon. That is, it is also possible to realize a three-dimensionally structured semiconductor device in which a reflection type AM-LCD is formed on a semiconductor circuit.

The semiconductor circuit may be a circuit formed on an SOI substrate such as a SIMOX, Smart-Cut (registered trademark by SOITEC INC.), ELTRAN (registered trademark by CANON INC.), etc.

In carrying out this embodiment, any of the structures of Embodiments 1 to 7 may be combined.

Embodiment 9

It is possible to use a variety of liquid crystal materials in a liquid crystal display device manufactured in accordance with the present invention. The following can be given as examples of the such materials: a TN liquid crystal; PDLC (polymer diffusion type liquid crystal); an FLC (ferroelectric liquid crystal); an AFLC (antiferroelectric liquid crystal); and a mixture of an FLC and an AFLC.

For example, the liquid crystal materials disclosed in: Furue, H, et al., "Characteristics and Driving Scheme of Polymer-stabilized Monostable FLCD Exhibiting Fast Response Time and High Contrast Ratio with Gray-scale Capability," SID, 1998; in Yoshida, T., et al., "A Full-color Thresholdless Antiferroelectric LCD Exhibiting Wide Viewing Angle with Fast Response Time," SID 97 Digest, 841, 1997; and in U.S. Pat. No. 5,594,569 can be used.

In particular, there are some that exhibit electrooptical response characteristics of V shape (or U-shape) among anti-ferroelectric liquid crystal material with no threshold value (thresholdless antiferroelectric LCD: abbreviated TL-AFLC) in which transmittivity continuously differentiate against the electric field, and one having the driver voltage of approximately ±2.5 V (cell thickness approximately 1 to 2 μm) is even found. Accordingly, there are cases in which the power supply voltage for the pixel circuit is required only 5 to 8V, and possibility for operating a driver circuit and a pixel matrix circuit at the same power supply voltage is suggested. Namely, the entire liquid crystal display device can be made low power consumption.

Further, ferroelectric liquid crystals and anti-ferroelectric liquid crystals possess an advantage in that they have a high response speed compared to TN liquid crystals. Since it is possible to realize an extremely fast operating speed TFT used in the present invention, it is possible to realize a liquid crystal display device with fast image response speed by sufficiently utilizing the fast response speed of ferroelectric liquid crystals and antiferroelectric liquid crystals.

Further, thresholdless anti-ferroelectric mixed liquid crystals have large spontaneous polarization in general and dielectric constant of the liquid crystal itself is high. Therefore relatively large storage capacitance is required in the pixels incase of using the thresholdless anti-ferroelectric mixed liquid crystals in the liquid crystal display device. Accordingly, it is preferable to use a thresholdless anti-ferroelectric mixed liquid crystal which has a small spontaneous polarization.

Note that the constitution of the present embodiment can be used in the AM-LCD shown in embodiments 2 and 6. Also, it is effective to use the liquid crystal display device of the present embodiment for the display section of electronic devices such as personal computers etc.

Embodiment 10

It is possible to apply the present invention to an active matrix EL (electro luminescence) display (also referred to EL display device). The example is shown in FIG. 12.

Figure 12:
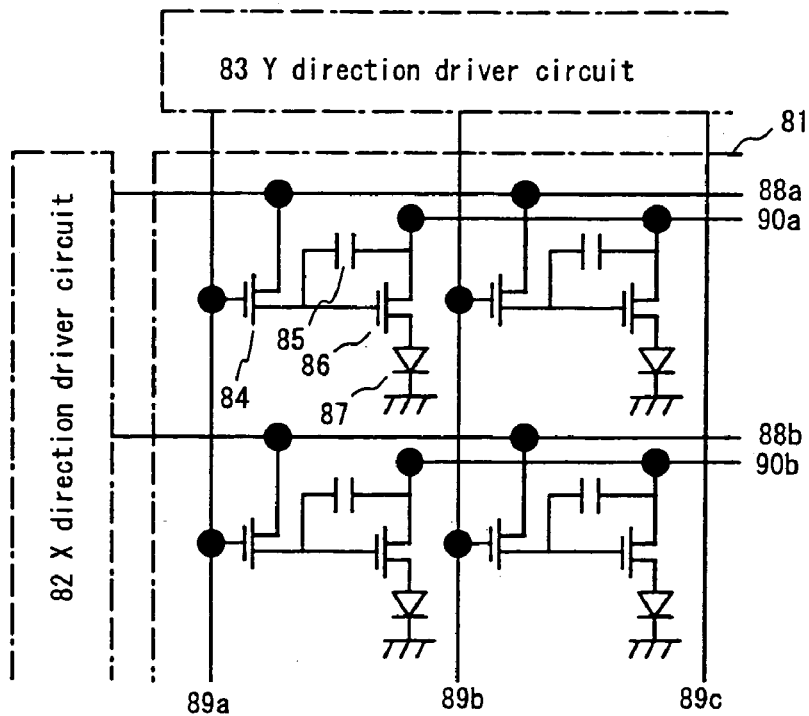
FIG. 12 is a view showing the structure of an active matrix EL display device.

FIG. 12 is a circuit diagram of the active matrix EL display of the present embodiment. Reference numeral 81 denotes a display region and X-direction (source side) driver circuit 82 and Y-direction (gate side) driver circuit 83 are provided in its peripheral. Each pixel of the display region 81 has a switching TFT 84, a capacitor 85, a current control TFT 86, an EL element 87, and X-direction signal line (source signal line) 88a (or 88b) and a Y-direction signal line (gate signal line) 89a (or 89b or 89c) are connected to the switching TFT 84. Power supply lines 90a and 90b are connected to the current control TFT 86.

In the active matrix EL display, CMOS circuit shown in FIG. 1 can be used as an X-direction driver circuit 82 or a Y-direction driver circuit, and a TFT of the same structure as the n-channel TFT of the CMOS circuit can be used as the current control TFT 86. Further, pixel TFT shown in FIG. 1 can be used for switching TFT 84.

Note that the active matrix EL display of the present embodiment may be fabricated by forming an EL layer by a publicly known method after fabricating the active matrix substrate shown in FIG. 4C. Accordingly, the use of manufacturing processes of Embodiment 1 is possible, and any constitution of Embodiments 3 to 5 and 7 may be combined.

Embodiment 11

Figure 13A:
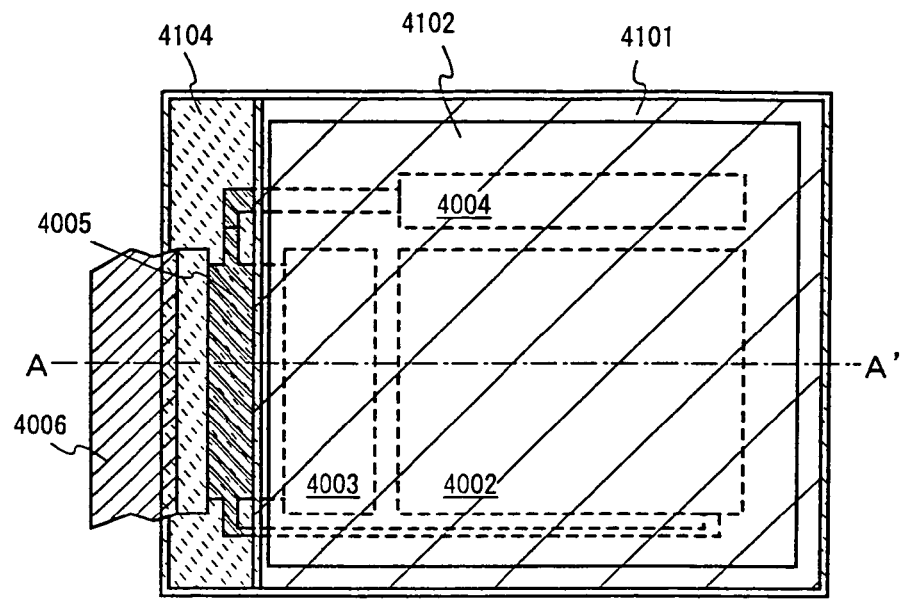
FIGS. 13A and 13B are views showing the top structure and the sectional structure of an EL display device, respectively.

An example of fabricating an EL (electro luminescence) display device by using the present invention is described in this embodiment. FIG. 13A is a top view of the EL display device of the present invention and FIG. 13B is its cross sectional view.

In FIG. 13A, reference numeral 4002 denotes a pixel section formed over a substrate 4001 (see FIG. 13B); 4003, source side driver circuit; 4004, gate side driver circuit. Each driver circuit reaches FPC. (flexible print circuit) 4006 through wiring 4005 and connected to the external machinery.

Here, the first sealing material 4101, cover material 4102 and fillings 4103 and the second sealing material 4104 are provided to surround the pixel section 4002, source side driver circuit 4003 and gate side driver circuit 4004.

Figure 13B:
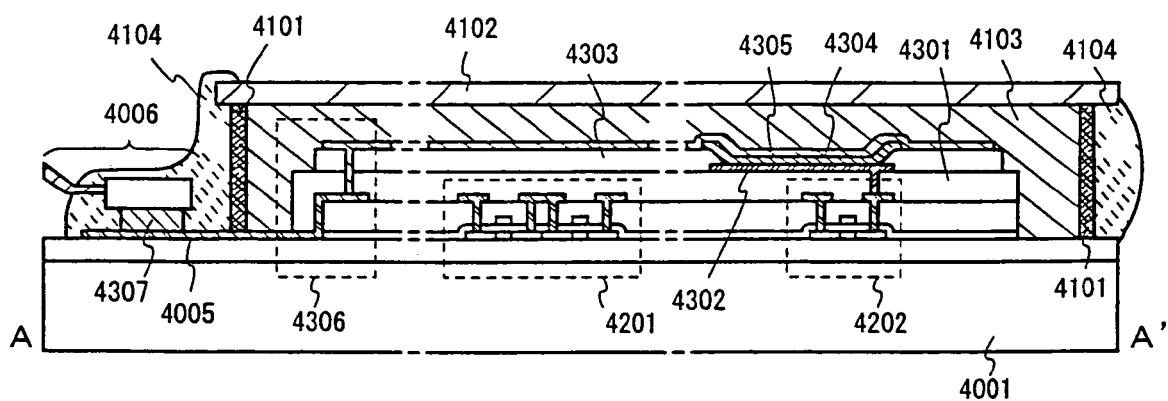

FIG. 13B corresponds a cross section at line A-A' of FIG. 13A. A driver circuit TFT (an n-channel TFT and a p-channel TFT are shown here) 4201 which comprises a source side driver circuit 4003 and a current control TFT (TFT that controls the current to the EL) that comprises a pixel section 4002 are formed over the substrate 4001.

In the present embodiment a CMOS circuit of the same structure as the CMOS circuit of FIG. 1 is used for driver TFT 4201, and a TFT of the same structure as pixel TFT of FIG. 1 is used for the current control TFT 4202. Further, a storage capacitor (not shown) connected to the gate of the current control TFT 4202 is disposed in the pixel section 4002 in the same structure as the storage capacitor of FIG. 1.

An interlayer insulating film (a planarization film) 4301 comprising resin is material is formed over driver TFT 4201 and pixel TFT 4202. Pixel electrode (anode) 4302 is formed thereon that is electrically connected to the drain of pixel TFT 4202. A transparent conductive film having a large work function is used as the pixel electrode 4302. A compound of indium oxide and tin oxide, a compound of indium oxide and zinc oxide, tin oxide or indium oxide can be used for the transparent conductive film. Further, gallium may be added to the transparent conductive film.

An insulating film 4303 is formed on pixel electrode 4302, and an opening is formed in insulating film 4303 at an area over pixel electrode 4302. EL (electro-luminescence) layer 4304 is formed on pixel electrode 4302 in the opening section. A publicly known organic EL material or inorganic EL material can be used for the EL layer 4304. There are monomer type material and polymer type material in the organic material, and either can be used.

The formation method of EL layer 4304 may apply publicly known evaporation technique or coating technique. The structure of EL layer may be a single layer structure or a laminate structure in which hole injection layer, hole transport layer, illumination layer, electron transport layer and electron injection layer are freely combined.

A cathode 4305 comprising a conductive film having light shielding property (typically a conductive film whose principal component is aluminum, copper or silver, or a laminate film of these and other conductive film) is formed over EL layer 4304. It is preferable to remove as much as possible of the moisture and oxygen existing in the interface between the cathode 4305 and the EL layer 4304. Therefore, it is necessary to form these films continuously in a vacuum, or to form the EL layer 4304 in a nitrogen atmosphere or in a noble gas and then form cathode.4305 keeping out the contact of oxygen and moisture. In the present embodiment deposition described above is enabled by using deposition apparatus of multi-chamber method (cluster-tool method).

Cathode 4305 is electrically connected to wiring 4005 in the region shown as 4306. Wiring 4005 is a wiring for applying a determined voltage to the cathode 4305 and is connected to FPC 4006 through anisotropic conductive film 4307.

As described above, EL elements comprising pixel electrode (anode) 4302, EL layer 4304 and cathode 4305 are formed. EL elements are surrounded by a first sealing material 4101 and a cover material 4102 stuck to substrate 4001 by first sealing material 4101, and sealed with fillings 4103.

As the cover material 4102, glass plate, metal plate (typically stainless steel plate), ceramics plate and plastic plate can be used. As a plastic plate, FRP (fiberglass-reinforced plastics) plate, PVF (polyvinyl fluoride) film, Myler film, polyester film or acrylic film can be used. Further, a sheet having a structure in which aluminum foil is sandwiched by PVF film or Myler film can be used.

Note however, the cover material need to be transparent in case that radiation from EL elements are directed to the direction toward cover material. In such cases, transparent substances such as glass plate, plastic plate, polyester film or acrylic film are used.

A ultraviolet ray curing resin or a thermosetting resin can be used as fillings 4103, and PVC (polyvinyl chloride), acrylic, polyimide, epoxy resin, silicone resin, PVB (polyvinyl butyral), or EVA (ethylene vinyl acetate) can be used. If a drying agent (preferably barium oxide) is formed on the inside of the fillings 4103, deterioration of EL elements can be prevented.

Further, spacers may be included within the filler 4103. When the spacers are formed of from barium oxide, it is possible to give the ability to absorb moisture to the spacers themselves. In addition, it is effective to provide a resin film over cathode 4305, as a buffer layer that releases pressure from the spacers in case of disposing the spacers.

The wiring 4005 is electrically connected to the FPC 4006 through anisotropic conductive film 4307. Wirng 4005 transmits signals that are sent to pixel section 4002, source side driver circuit 4003 and gate side driver circuit 4004 from FPC 4006, and is electrically connected to an external device by FPC 4006.

In the present embodiment a structure that thoroughly shields the EL elements from external atmosphere is employed in which second sealing material 4104 is provided so as to cover the exposed portions of first sealing material 4101 and a part of FPC 4006. Thus an EL display device having a cross sectional structure of FIG. 13B is complete. Note that EL display device of the present embodiment may be fabricated in combination with any constitution of embodiments 1, 3 to 5, 7 and 8.

Figure 14:
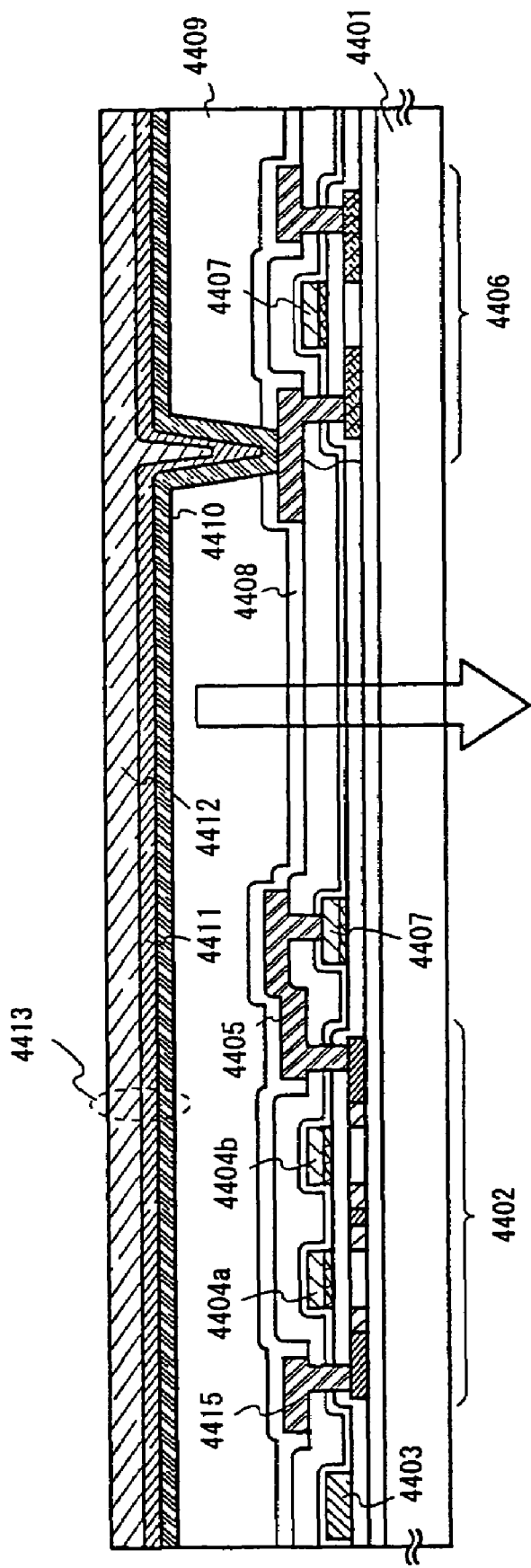
FIG. 14 is a view showing the sectional structure of an EL display device.
Figure 15A:
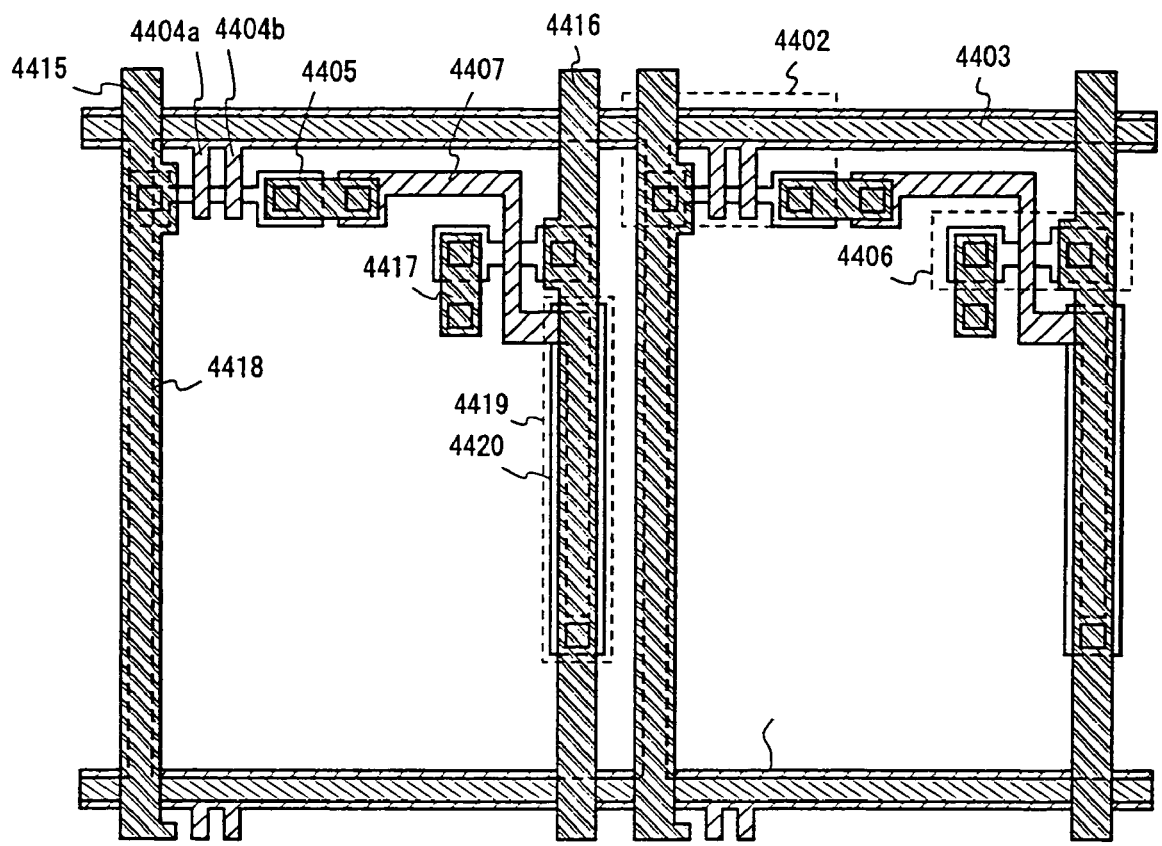
FIGS. 15A and 15B are views each showing the top structure of a pixel portion in an EL display device.
Figure 15B:
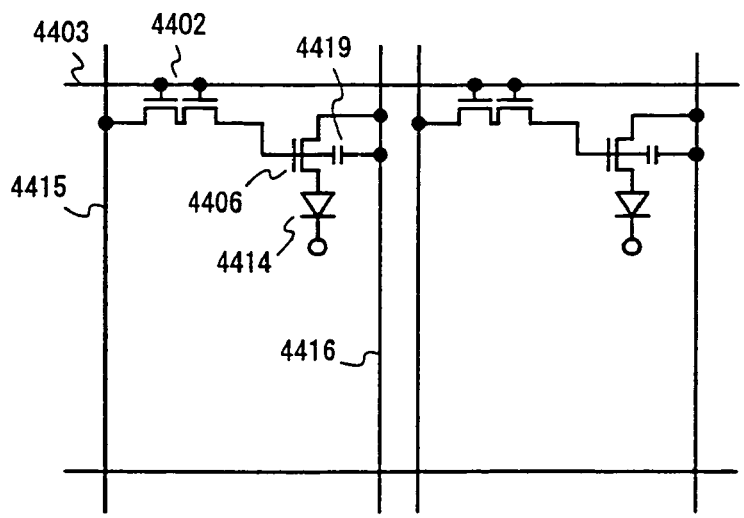

A more detailed structure on a cross section of pixel section is shown in FIG. 14, a top view is shown in FIG. 15A, and circuit diagram is shown in FIG. 15B. Common reference numerals are used in FIGS. 14, 15A and 15B, so that the figures may be compared with each other.

In FIG. 14, switching TFT 4402 disposed over substrate 4401 comprises a pixel TFT provided in the pixel section of FIG. 1. Accordingly, the description of the pixel TFT of FIG. 1 may be referred for the description of the structure. The wiring shown by 4403 is a gate wiring that electrically connects gate electrodes 4404a and 4404b of switching TFT 4402.

The drain wiring 4405 of switching TFT 4402 is electrically connected to gate electrode 4407 of current control TFT 4406. Note that current control TFT 4406 is comprised of a p-channel TFT that forms CMOS circuit of FIG. 1. Accordingly, the description of the p-channel TFT of FIG. 1 may be referred. Note that while the present embodiment uses a single gate structure, a double gate structure or a triple gate structure may also be used.

A first passivation film 4408 is disposed over the switching TFT 4402 and the current control TFT 4406, and a planarization film 4409 comprising resin is formed on top. It is very important to flatten by using the planarization film 4409, the step due to the TFTs. Since an EL layer formed later is extremely thin, there are cases in which defective luminescence is caused due to the existence of the step. Therefore, it is preferable to planarize before forming pixel electrode so as to form an EL layer on a planarized surface as possible.

The reference numeral 4410 denotes a pixel electrode (anode of EL element) comprising a transparent conductive film, and is electrically connected to the drain wiring 4411 of current control TFT 4406. A pixel electrode 4410 can be formed from a compound comprising indium oxide and tin oxide, a compound comprising indium oxide and zinc oxide, zinc oxide, tin oxide or indium oxide as the transparent conductive film. Further, said conductive transparent including gallium may also be used.

An EL layer 4412 is formed on pixel electrode 4410. Note that while FIG. 14 shows only 1 pixel, EL layers corresponding to each colors of R (red), G (green) and B (blue) are each formed properly in the present embodiment. A small molecular type organic EL material is formed by evaporation in the present embodiment. In concrete, a laminate structure is formed from a copper phthalocyanine (CuPc) film of 20 nm disposed as a hole injection layer, and tris-8-quinolinolate aluminum complex ($Alq_3$) film formed thereon into 70 nm thickness as a luminescent layer. A luminescent color may be controlled by adding fluorescent dye into $Alq_3$.

However, the above example is one example of the organic EL materials that can be used as luminescence layers, and it is not necessary to limit to these materials. An EL layer (a layer for luminescence and for performing carrier motion for luminescence) may be formed by freely combining luminescence layer, charge transport layer, or charge injection layer. For example, an example using small molecular type materials as luminescence layers is shown in the present embodiment, but polymer type organic EL materials may also be used. Further, it is possible to use inorganic materials such as silicon carbide, etc., as charge transport layer and charge injection layer.

Publicly known materials can be used for these organic EL materials and inorganic materials.

A cathode 4413 comprising a conductive film having light shielding property is next formed on EL layer 4412. In the case of the present embodiment, an alloy film of aluminum and lithium is used as the conductive film having light shielding property. Needless to say, a publicly known MgAg film (alloy film of magnesium and silver) may also used. As the cathode material, a conductive film comprising an element belonging to periodic table group 1 or 2, or a conductive film added with at least one of these elements, may be used.

EL element 4414 is completed at the point when this cathode 4413 is formed. Note that an EL element 4414 formed here represents a capacitor comprising pixel electrode (anode) 4410, EL layer 4412 and cathode 4413.

The top view of the pixel in the present embodiment is next described by using FIG. 15A. Source region of switching TFT 4402 is connected to source wiring 4415 and drain region is connected to drain wiring 4405. Further, drain wiring 4405 is electrically connected to gate electrode 4407 of current control TFT 4406. Source region of current control TFT 4406 is electrically connected to current supply line 4416 and drain region is electrically connected to drain wiring 4417. Drain wiring 4417 is electrically connected to pixel electrode (anode) 4418 shown by dotted line.

Here, a storage capacitor is formed in the region shown by 4419. Storage capacitor 4419 is formed from a semiconductor film 4420 electrically connected to current supply line 4416, an insulating film formed of the same layer as gate insulating film (not shown) and gate electrode 4407. Further, it is possible to use a capacitance formed from gate electrode 4407, a layer formed from the same layer as the first interlayer insulating film (not shown) and current supply line 4416, for a storage capacitor.

Note that it is possible to freely combine the constitution of the present embodiment with any constitution of Embodiments 1, 3 to 5, 7 and 8.

Embodiment 12

Figure 16:
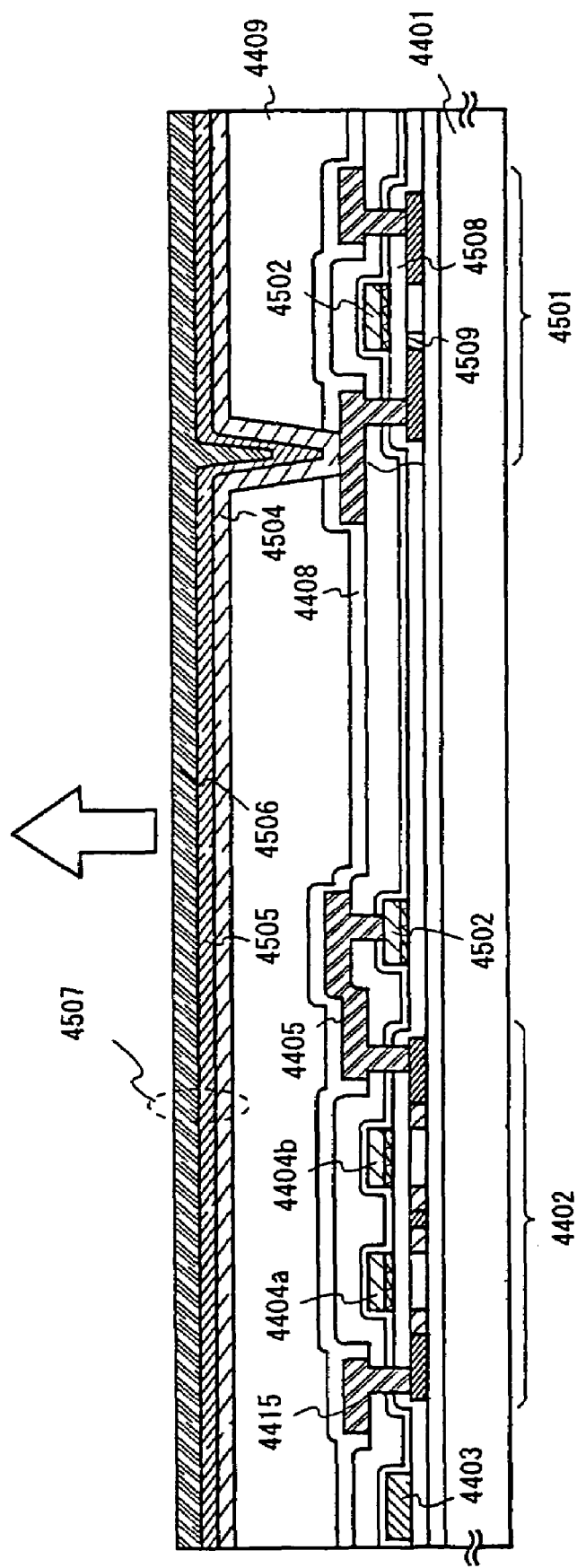
FIG. 16 is a view showing the sectional structure of an EL display device.

In embodiment 12 an EL display device having a pixel structure differing from embodiment 11 is described. FIG. 16 is used for explanation. Note that the description of embodiment 11 may be referred regarding parts where the same reference numerals as FIG. 14 are given.

In FIG. 16 a TFT having the same structure as n-channel TFT that forms CMOS circuit of FIG. 1 is used as current control TFT 4501. Needless to say, gate electrode 4502 of current control TFT 4501 is connected to drain wiring 4405 of switching TFT 4402. Drain wiring 4503 of current control TFT 4501 is electrically connected to pixel electrode 4504.

Since the degradation due to hot carrier effect becomes distinguished when the voltage applied to the EL elements is 10V or greater, it is effective to use a TFT of the same structure as n-channel TFT 302 of FIG. 1 for the current control TFT 4501. Further, because degradation due to hot carrier effect is not a serious problem in case that the voltage applied to EL elements is 10V or less, a TFT which has a structure omitting LDD region 114 from n-channel TFT 302 may be used.

In embodiment 12 pixel electrode 4504 is formed by using a conductive film having light shielding property, and functions as a cathode of EL element. An alloy film of aluminum and lithium is used in concrete, but a conductive film comprising an element belonging to periodic table group 1 or 2, or a conductive film added with such element may be used here.

EL film 4505 is formed on top of pixel electrode 4504. Note that though FIG. 16 shows only 1 pixel, EL layer corresponding to G (green) is formed in embodiment 12 by evaporation method or coating method (preferably spin coating). In concrete, it is a laminate structure comprising a lithium fluoride (LiF) film of 20 nm thickness provided as electron injection layer and a PPV (poly-p-phenylene vinylene) of 70 nm thickness provided thereon as luminesence layer.

An anode 4506 comprising transparent conductive film is next disposed on EL layer 4505. In embodiment 12, a compound comprising indium oxide and tin oxide, or a compound comprising indium oxide and zinc oxide, zinc oxide, tin oxide or indium oxide is used as the transparent conductive film. Further, said transparent conductive added with gallium may also be used.

On completing formation of anode 4506, an EL element 4507 is finished. Note that EL element 4507 represents here a capacitor formed from pixel electrode (cathode) 4504, EL layer 4505 and anode 4506.

Note that, the current control TFT 4501 of embodiment 12 forms a parasitic capacitance, which is referred to as gate capacitor, in between gate electrode 4502 and LDD regions 4509a and 4509b. It is possible to provide the same function as storage capacitor 4418 shown in FIGS. 15A and 15B by adjusting this gate capacitor. Specifically in case of driving the EL display device by digital driving method, it is possible to use the gate capacitor for storage capacitor because the capacitance of storage capacitor is small compared to the case of driving by analog driving method.

Note that it is possible to freely combine the constitution of the present embodiment with the any constitution of Embodiments 1, 3 to 5, 7 and 8.

Embodiment 13

Figure 17A:
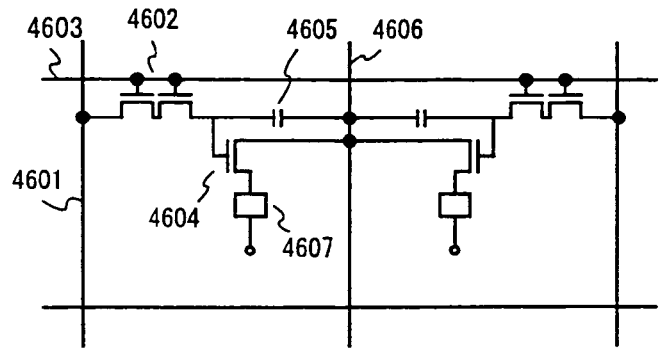
FIGS. 17A to 17C are views each showing the circuit structure of a pixel portion in an EL display device.
Figure 17B:
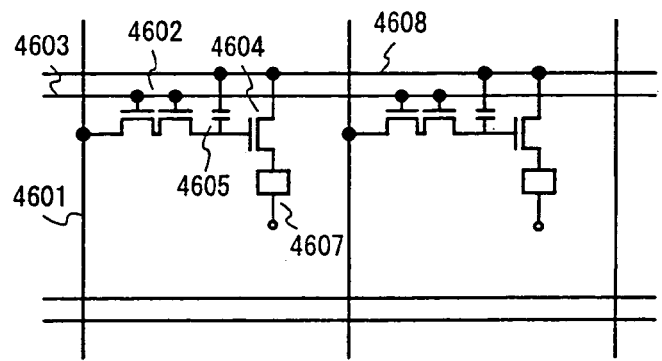
Figure 17C:
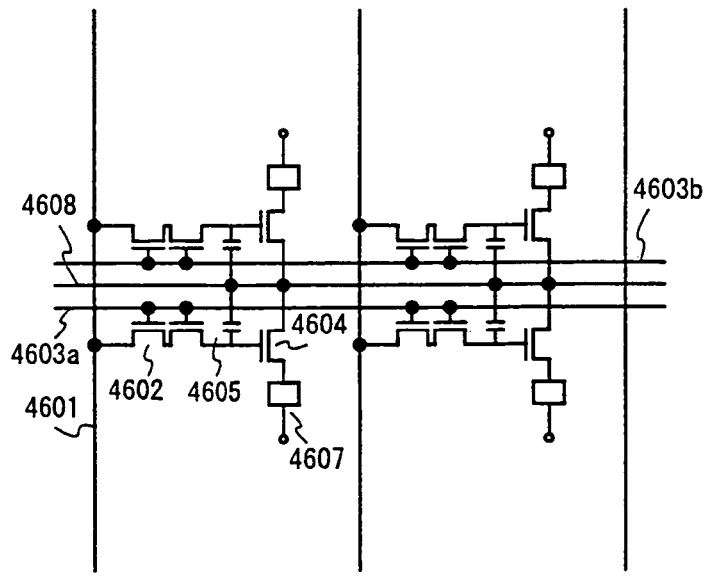

In embodiment 13, examples of pixel structures of EL display device shown in Embodiments 11 and 12 are shown in FIGS. 17A to 17C. Note that in embodiment 13, reference numeral 4601 denotes a source wiring of a switching TFT 4602; 4603 denotes a gate wiring of the switching TFT 4602; 4604 denotes a current control TFT; 4605 denotes a capacitor; 4606 and 4608 denote current supply lines; and 4607 denotes an EL element.

FIG. 17A is an example of a case in which the current supply line 4606 is shared between two pixels. Namely, this is characterized in that two pixels are formed having linear symmetry around the current supply line 4606. In this case the number of power supply lines can be reduced, so the pixel section can be made higher definition.

FIG. 17B is an example of a case in which the current supply line 4608 is formed parallel to the gate wiring 4603. Note that FIG. 17B has a structure in which the current supply line 4608 and the gate wiring 4603 are formed so as not to overlap. However in case these are wirings formed on different layers, they can be provided so as to overlap by interposing an insulating film. In this case, the area used exclusively by the current supply line 4608 and the gate wiring 4603 can be shared, so the pixel section can be made even higher definition.

Furthermore, FIG. 17C. is characterized in that the current supply line 4608 is formed parallel to gate wiring 4603, similar to the structure of FIG. 17B, and in addition, two pixels are formed to have linear symmetry around the current supply line 4608. It is also effective to form the current supply line 4608 to overlap one of gate wiring 4603a or 4603b. In this case the number of power supply lines can be reduced, so the pixel section can be made higher definition.

Embodiment 14

Figure 18A:
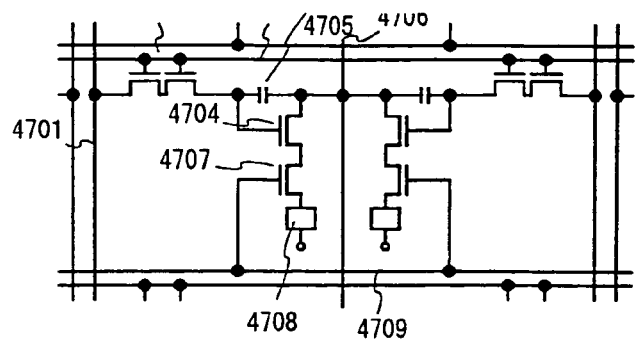
FIGS. 18A and 18B are views each showing the circuit structure of a pixel portion in an EL display device.
Figure 18B:
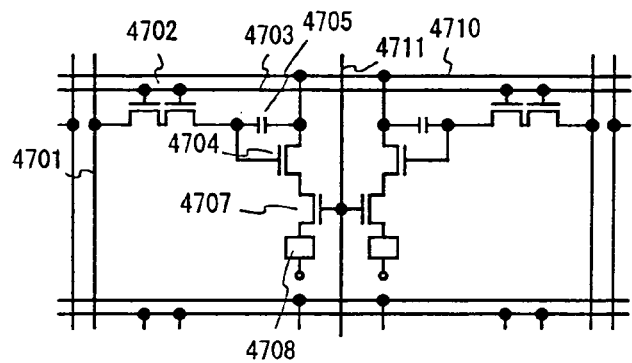

In the present embodiment examples of pixel structures of EL display devices shown in Embodiments 11 and 12 are shown in FIGS. 18A and 18B. Note that in the present embodiment reference numeral 4701 is a source wiring of switching TFT 4702; 4703, gate wiring of switching TFT 4702; 4704, current control TFT; 4705, capacitor (can be omitted); 4706, current supply line; 4707, power source control TFT; 4708, gate wiring for power source control; and 4709, EL element. Japanese Patent Application No. Hei 11-341272 may be referred as to operation of power source control TFT 4707.

Further, though the present embodiment provides the power source control TFT 4707 between current control TFT 4704 and EL element 4708, it may be a structure in which current control TFT 4704 is provided between power source control is TFT 4707 and EL element 4708. Moreover, it is preferable to form the power source control TFT 4707 in the same structure as the current control TFT 4704, or formed connected in series by the same active layer.

FIG. 18A is an example of a case in which current supply line 4706 is shared between 2 pixels. Namely it is characterized in that 2 pixels are formed in linear symmetry around the current supply line 4706. In this case, because the number of current supply lines can be reduced, pixel section can be further made into high definition.

FIG. 18B is an example of a case in which current supply line 4710 is provided in parallel with the gate wiring 4703 and power supply control gate wiring 4711 is provided in parallel with the source wiring 4701. Though the current supply line 4710 and gate wiring 4703 are provided so as not to overlap in FIG. 18B, these can be provided to overlap by interposing an insulating film is these are wirings formed in different layers. In this case, the area used exclusively by the current supply line 4710 and the gate wiring 4703 can be shared, so the pixel section can be made even higher definition.

Embodiment 15

Figure 19A:
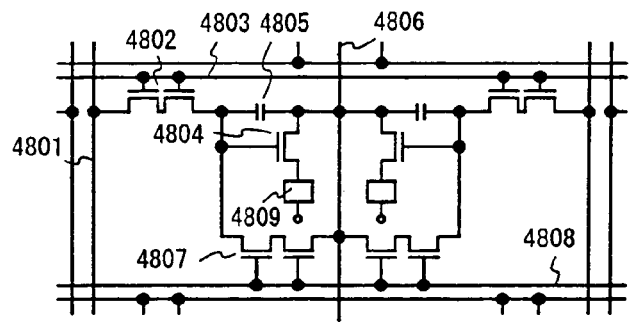
FIGS. 19A and 19B are views each showing the circuit structure of an EL display device.
Figure 19B:
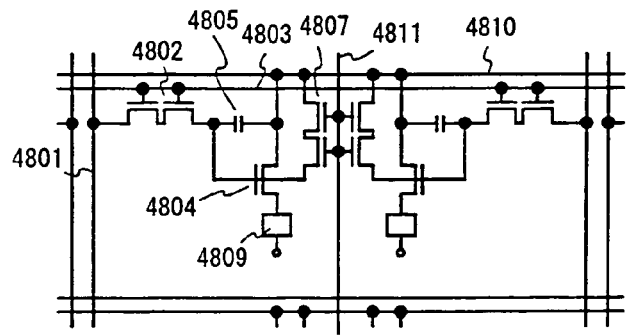

This embodiment gives a description with reference to FIGS. 19A and 19B on an example of the pixel structure for the EL display device shown in Embodiment 11 or 12. In this embodiment, reference symbol 4801 denotes a source wiring of a switching TFT 4802, 4803, a gate wiring of the switching TFT 4802, 4804, a current controlling TFT, 4805, a capacitor (may be omitted), 4806, a current supply line, 4807, an erasing TFT, 4808, an erasing gate electrode, and 4809, an EL device. Japanese Patent Application No. Hei. 11-338786 may be referred for the operation of the erasing TFT 4807.

A drain of the erasing TFT 4807 is connected to a gate of the current controlling TFT 4804 so that the gate voltage of the current controlling TFT 4804 can forcibly be changed. The erasing TFT 4807 may be either of N channel type or of P channel type, but preferably has the same structure as the switching TFT 4802 to reduce the OFF current.

FIG. 19A shows an example in which two pixels share the current supply line 4806. That is, the example is characterized in that two pixels are formed such that they are symmetric with respect to the current supply line 4806. In this case, the number of current supply lines can be reduced to obtain even higher definition for the pixel portion.

FIG. 19B shows an example in which a current supply line 4810 is formed in parallel with the gate wiring 4803 and an erasing gate wiring 4811 is formed in parallel with the source wiring 4801. The current supply line 4810 and the gate wiring 4803 are formed so as not to overlap with each other in FIG.

19B. However, they may overlap with each other through an insulating film as long as the pixel is wired such that they are formed in different layers. In this case, the current supply line 4810 and the gate wiring 4803 share their occupied areas to obtain even higher definition for the pixel portion.

Embodiment 16

An EL display device according to the present invention may have any number of TFTs in a pixel. Though shown in Embodiments 14, 15 are examples in each of which three TFTs are formed in a pixel, four to six TFTs may be provided. The present invention can be carried out without putting limitation to the pixel structure of the EL display device.

Embodiment 17

Electrooptical devices and semiconductor circuits of the present invention can be utilized for display section of an electric machine and signal processing circuits. Following can be given as such electric machines: video cameras; digital cameras; projectors; projection TVs; goggle type displays (head mounted displays); navigation systems; sound reproduction devices; notebook type personal computers; game machines; portable information terminals (mobile computers, portable telephones, portable game machines or electronic books, etc.); image reproduction devices having recording medium, etc. Examples of these electric machines are shown in FIGS. 20A to 22B.

Figure 20A:
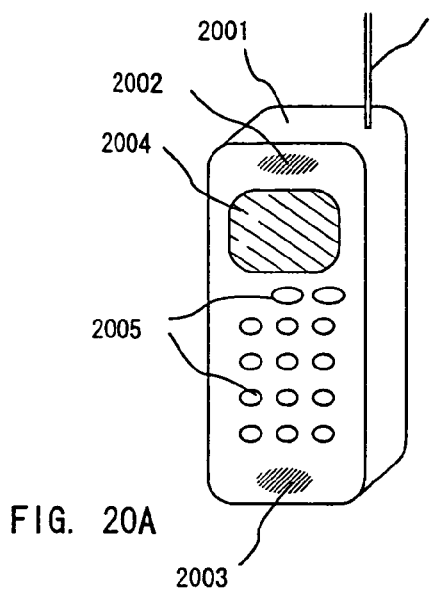
FIGS. 20A to 20F are views showing examples of electric appliance.

FIG. 20A is a portable telephone, and comprises: a main body 2001; a voice output section 2002; a voice input section 2003; a display section 2004; operation switches 2005; an antenna 2006. The electrooptical device of the present invention can be used in the display section 2004, and the semiconductor circuits of the present invention can be used in the voice output section 2002, the voice input section 2003 or CPU and memory etc.

Figure 20B:
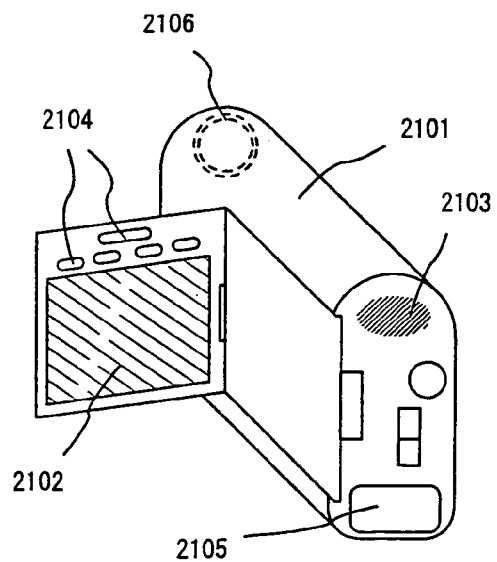

FIG. 20B is a video camera, and comprises: a main body 2101; display section 2102; a voice input section 2103; operation switches 2104; a battery 2105; and an image receiving section 2106. The electrooptical device of the present invention can be used in the display section 2102, and the semiconductor circuits of the present invention can be used for the voice input section 2103, CPU or memory etc.

Figure 20C:
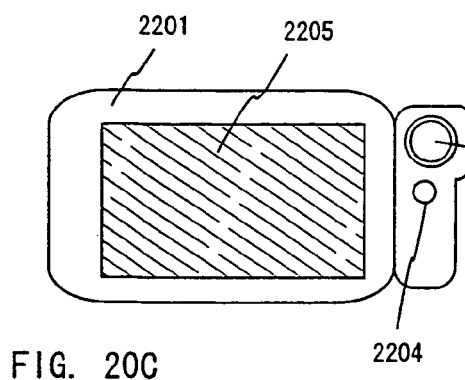

FIG. 20C is a mobile computer, and comprises: a main body 2201; a camera section 2202; an image receiving section 2203; operation switches 2204; and a display section. The electrooptical device of the present invention can be used in the display section 2205 and the semiconductor circuits of the present invention can be used for CPU or memory etc.

Figure 20D:
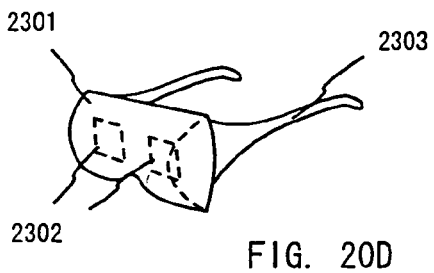

FIG. 20D is a goggle type display and comprises: a main body 2301; a display section 2302; and an arm section 2303. The electrooptical device of the present invention can be used in the display section 2302, and the semiconductor circuits of the present invention can be used in CPU or memory etc.

Figure 20E:
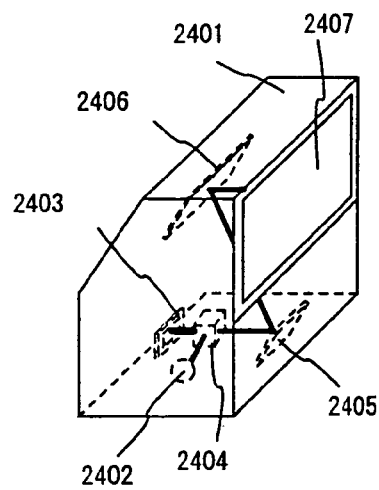

FIG. 20E is a rear projector (projection TV) and comprises: a main body 2401; a light source 2402; a liquid crystal display device 2403; polarizing beam splitter 2404; reflectors 2405 and 2406; and a screen 2407. The present invention can be used in the liquid crystal display device 2403, and semiconductor circuits of the present invention can be used for CPU and memory etc.

Figure 20F:
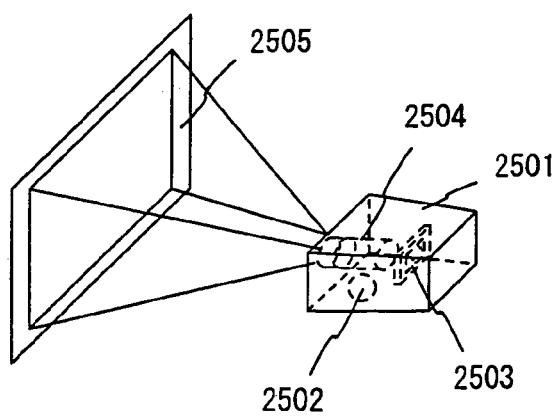

FIG. 20F is a front projector and comprises: a main body 2501; a light source 2502; a liquid crystal display device 2503; an optical system 2504; and a screen 2505. The present invention can be used in the liquid crystal display device 2502, and semiconductor circuits of the present invention can be used for CPU and memory etc.

Figure 21A:
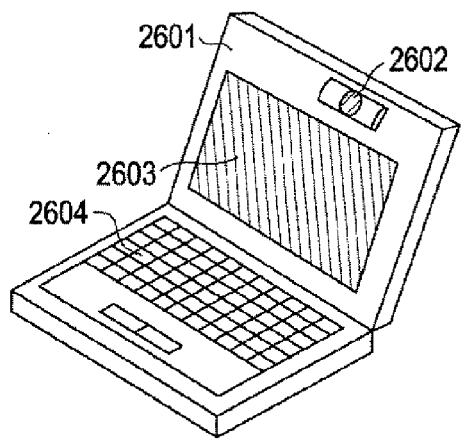
FIGS. 21A to 21D are views showing examples of electric appliance.

FIG. 21A is a personal computer and comprises: a main body 2601; an image input section 2602; a display section 2603; a key board 2604, etc. The electrooptical device of the present invention can be used in the display section 2603, and the semiconductor circuits of the present invention can be used in CPU or memory etc.

Figure 21B:
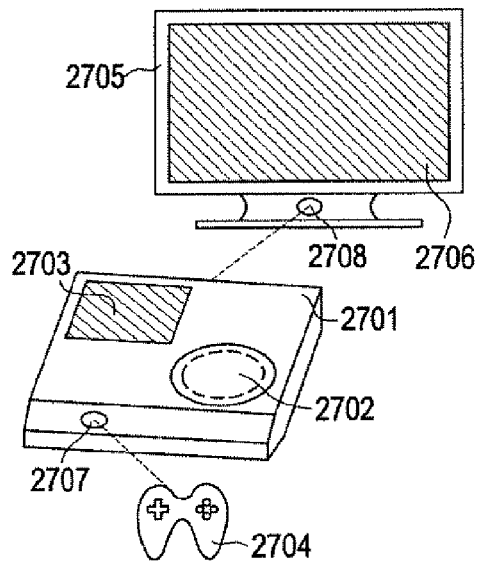

FIG. 21B is an electronic game machine and comprises: a main body 2701; a recording medium 2702; a display section 2703; and a controller 2704. The sound and image outputted from this electronic game machine are reproduced by the outside cover 2705 and a display comprising the display section 2706. Wire communication, wireless communication or light communication can be used for the communication means between the controller 2704 and the main body 2701, or the electronic game machine and the display. In the present embodiment it is structured that infrared ray is detected by the sensor sections 2707 and 2708. The electrooptical device of the present invention can be used in the display section 2703 and 2706, and the semiconductor circuits of the present invention can be used in CPU or memory etc.

Figure 21C:
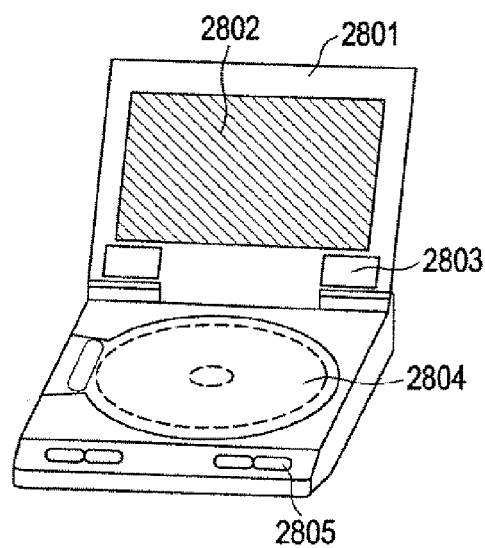

FIG. 21C is a player (image reproduction device) using a recording media which records a program (hereinafter referred to as a recording medium) and comprises: a main body 2801; a display section 2802; a speaker section 2803; a recording medium 2804; and operation switches 2805: This image reproduction device can be used for music appreciation, film appreciation, games and the use for Internet by using DVD (digital versatile disc) and CD etc. For the recording medium. The electrooptical device of the present invention can be used in the display section 2802, and the semiconductor circuits of the present invention can be used in CPU or memory etc.

Figure 21D:
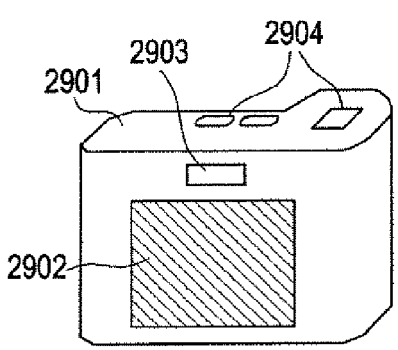

FIG. 21D is a digital camera and comprises: a main body 2901; a display section 2902; a view finder 2903; operation switches 2904; and image receiving section (not shown). The electrooptical device of the present invention can be used in the display section 2902, and the semiconductor circuits of the present invention can be used in CPU or memory etc.

Figure 22A:
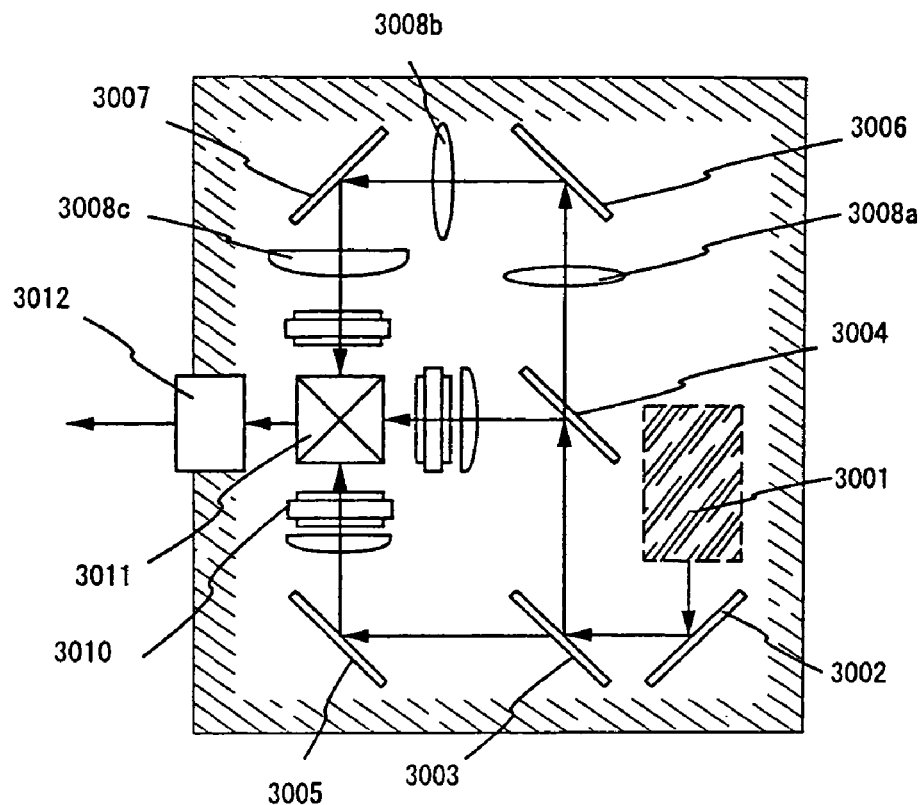
FIGS. 22A and 22B are views each showing the structure of an optical engine.
Figure 22B:
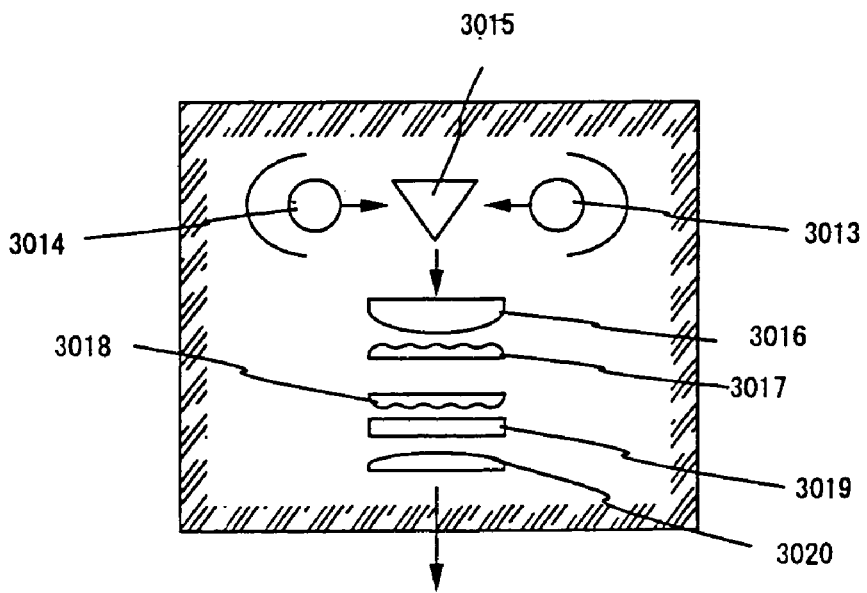

Detail description of the optical engine that can be used in the rear projector of FIG. 20E and the front projector of FIG. 20F is shown by FIGS. 22A and 22B. Note that FIG. 22A is an optical engine and FIG. 22B is an optical light source system incorporated into the optical engine.

The optical engine shown in FIG. 22A comprises an optical light source system 3001, mirror 3002 and 3005 to 3007, dichroic mirrors 3003 and 3004, optical lenses 3008a to 3008c, a prism 3011, a liquid crystal display device 3010, and a projection optical system 3012. The projection optical system 3012 is an optical system incorporating a projection lens. Though the present embodiment showed an example of 3-plate type which uses 3 liquid crystal display devices 3010, it may be a single plate type. An optical lens, a film having a polarizing function, a film for adjusting phase difference, or IR film, etc. may be provided in the optical path shown by an arrow in FIG. 22A.

As shown in FIG. 22B, an optical light source system 3001 comprises a light source 3013 and 3014, a composing prism 3015, a collimating lens 3016 and 3020, lens arrays 3017 and 3018, and polarizing inversion element 3019. Though the optical light source system shown in FIG. 22B uses 2 light sources, it may be 1, or 3 or more. An optical lens, a film having a polarizing function, a film for adjusting phase differences, or IR film, etc. may be provided in the optical path of the optical light source system.

As described above, the applicable range of the present invention is very large, and it is possible to apply to electric machines of various areas. Further, the electric machines of the present embodiment can be realized by combining the constitutions of Embodiments 1 to 16 as occasion demands.

Using the present invention, TFTs having gate insulating films different from one another in thickness may be formed on the same substrate. This makes it possible to arrange TFTs having appropriate capabilities in accordance with ways the respective portions require in an electrooptical device represented by an AM-LCD, an EL display device, etc., greatly improving performance and reliability of the electrooptical device. This also improves performance and reliability of an electronic equipment having such electrooptical device as a display unit.

In addition, the invention allows thinning of the dielectric for the storage capacitor in the pixel portion of the electrooptical device without increasing the number of steps, so that the storage capacitance to be formed has a large capacitance while occupying a small area. Furthermore, the pixel TFT can be reduced in size without impairing the conventional functions, securing a sufficient capacitance for the storage capacitor while avoiding lowering of the opening ratio even in a small electrooptical device, as in a device whose diagonal length is 2 inches.

What is claimed is:

1. A method of manufacturing a semiconductor device, comprising the steps of:
   forming a semiconductor layer on an insulator;
   doping a part of said semiconductor layer with an element that belongs to group XV in the periodic table to form a low concentration impurity region;
   doping at least two parts of said semiconductor layer with the element that belongs to group XV in the periodic table at a concentration higher than said low concentration impurity region to form a first high concentration impurity region and a second high concentration impurity region;
   forming an insulating film on said semiconductor layer; and
   forming a gate wiring and a capacitor electrode on said insulating film, wherein said gate wiring overlaps with said first high concentration impurity region and said second high concentration impurity region is formed below said capacitor electrode.

2. The method according to claim 1, wherein said low concentration impurity region is doped with the element that belongs to group XV in the periodic table in a concentration of $2\times10^{16}$ to $5\times10^{19}$ atoms/cm$^3$, and said first and second high concentration impurity regions are doped with the element in a concentration of $5\times10^{19}$ to $3\times10^{21}$ atoms/cm$^3$.

3. The method according to claim 1, further comprising the steps of:
   forming an insulating film over the gate wiring; and
   forming a wiring over the insulating film, wherein said wiring extends in a direction different from a direction in which the gate wiring extends,
   wherein a first portion of said wiring overlapped with said gate wiring has smaller line width than a second portion of said wiring not overlapped with said gate wiring.

4. The method according to claim 3, further comprising the step of:
   forming a pixel electrode, wherein a portion of said second portion of said wiring overlaps with said pixel electrode.

5. The method according to claim 1, wherein said semiconductor device is an electronic equipment selected from the group consisting of a video camera, a digital camera, a projector, a projection TV, a goggle type display, a navigation system, a sound reproduction device, a notebook type personal computer, a game machine, a portable information terminal, a mobile computer, a portable telephone, a portable game machine, an electronic book, and an image reproduction device having a recording medium.

6. A method of manufacturing a semiconductor device having a pixel portion comprising a plurality of pixels each having a pixel TFT and a storage capacitor, said method comprising the steps of:
   forming a semiconductor layer on an insulator;
   doping a part of said semiconductor layer with an element that belongs to group XV in the periodic table to form a low concentration impurity region;
   doping a part of said semiconductor layer with the element that belongs to group XV in the periodic table at a concentration higher than said low concentration impurity region to form a first high concentration impurity region and a second high concentration impurity region;
   forming an insulating film over said semiconductor layer, wherein said insulating film has a first region having a first thickness and a second region having a second thickness thinner than the first thickness; and
   forming a gate wiring on the first region of said insulating film, and forming at the same time a capacitor electrode on the second region of said insulating film,
   wherein said first high concentration impurity region is formed below said gate wiring and said second high concentration impurity region is formed below said capacitor electrode.

7. The method according to claim 6, wherein said low concentration impurity region is doped with the element that belongs to group XV in the periodic table in a concentration of $2\times10^{16}$ to $5\times10^{19}$ atoms/cm$^3$, and said first and second high concentration impurity regions are doped with the element in a concentration of $5\times10^{19}$ to $3\times10^{21}$ atoms/cm$^3$.

8. The method according to claim 6, further comprising the steps of:
   forming an insulating film over the gate wiring; and
   forming a wiring over the insulating film, wherein said wiring extends in a direction different from a direction in which the gate wiring extends,
   wherein a first portion of said wiring overlapped with said gate wiring has smaller line width than a second portion of said wiring not overlapped with said gate wiring.

9. The method according to claim 8, further comprising the step of:
   forming a pixel electrode, wherein a portion of said second portion of said wiring overlaps with said pixel electrode.

10. The method according to claim 6, wherein said semiconductor device is an electronic equipment selected from the group consisting of a video camera, a digital camera, a projector, a projection TV, a goggle type display, a navigation system, a sound reproduction device, a notebook type personal computer, a game machine, a portable information terminal, a mobile computer, a portable telephone, a portable game machine, an electronic book, and an image reproduction device having a recording medium.

11. A method of manufacturing semiconductor device, comprising the steps of:
   forming a semiconductor layer on an insulator;
   forming a first low concentration impurity region, a second low concentration impurity region, and a third low concentration impurity region in the semiconductor layer by doping the semiconductor layer with an element that belongs to group XV in the periodic table;

doping a part of said second low concentration impurity region with the element that belongs to group XV in the periodic table at a concentration higher than said first to third low concentration impurity regions to form a high concentration impurity region, wherein said high concentration impurity region separates the second low concentration impurity region into two low concentration impurity regions;

forming an insulating film over said semiconductor layer; and forming a gate wiring over said insulating film in order to overlap the second low concentration impurity region and the high concentration impurity region.

12. The method according to claim 11, wherein said first, second and third low concentration impurity regions are doped with the element that belongs to group XV in the periodic table in a concentration of $2\times10^{16}$ to $5\times10^{19}$ atoms/cm$^3$, and said high concentration impurity region is doped with the element in a concentration of $5\times10^{19}$ to $3\times10^{21}$ atoms/cm$^3$.

13. The method according to claim 11, further comprising the steps of:

forming an insulating film over the gate wiring; and forming a wiring over the insulating film, wherein said wiring extends in a direction different from a direction in which the gate wiring extends, wherein a first portion of said wiring overlapped with said gate wiring has smaller line width than a second portion of said wiring not overlapped with said gate wiring.

14. The method according to claim 13, further comprising the step of:

forming a pixel electrode, wherein a portion of said second portion of said wiring overlaps with said pixel electrode.

15. The method according to claim 11, wherein said semiconductor device is an electronic equipment selected from the group consisting of a video camera, a digital camera, a projector, a projection TV, a goggle type display, a navigation system, a sound reproduction device, a notebook type personal computer, a game machine, a portable information terminal, a mobile computer, a portable telephone, a portable game machine, an electronic book, and an image reproduction device having a recording medium.

16. A method of manufacturing semiconductor device, comprising the steps of:

forming a semiconductor layer on an insulator;

forming a first low concentration impurity region, a second low concentration impurity region, and a third low concentration impurity region in the semiconductor layer by doping the semiconductor layer with an element that belongs to group XV in the periodic table;

doping a part of said second low concentration impurity region and a part of the semiconductor layer with the element that belongs to group XV in the periodic table at a concentration higher than said first to third low concentration impurity regions to form a first high concentration impurity region and a second high concentration impurity region, wherein said first high concentration impurity region separates the second low concentration impurity region into two low concentration impurity regions;

forming an insulating film over said semiconductor layer; and forming a gate wiring and a capacitor electrode over said insulating film, wherein said gate wiring overlaps the second low concentration impurity region and the first high concentration impurity region, and said capacitor electrode overlaps the second high concentration impurity region.

17. The method according to claim 16, wherein said first, second and third low concentration impurity regions are doped with the element that belongs to group XV in the periodic table in a concentration of $2\times10^{16}$ to $5\times10^{19}$ atoms/cm$^3$, and said first and second high concentration impurity regions are doped with the element in a concentration of $5\times10^{19}$ to $3\times10^{21}$ atoms/cm$^3$.

18. The method according to claim 16, further comprising the steps of:

forming an insulating film over the gate wiring; and forming a wiring over the insulating film, wherein said wiring extends in a direction different from a direction in which the gate wiring extends, wherein a first portion of said wiring overlapped with said gate wiring has smaller line width than a second portion of said wiring not overlapped with said gate wiring.

19. The method according to claim 18, further comprising the step of:

forming a pixel electrode, wherein a portion of said second portion of said wiring overlaps with said pixel electrode.

20. The method according to claim 16, wherein said semiconductor device is an electronic equipment selected from the group consisting of a video camera, a digital camera, a projector, a projection TV, a goggle type display, a navigation system, a sound reproduction device, a notebook type personal computer, a game machine, a portable information terminal, a mobile computer, a portable telephone, a portable game machine, an electronic book, and an image reproduction device having a recording medium.

* * * * *